(12) United States Patent
Hoshina et al.

(10) Patent No.: US 11,555,866 B2
(45) Date of Patent: Jan. 17, 2023

(54) MEASUREMENT APPARATUS, MEASUREMENT METHOD, AND COMPUTER-READABLE RECORDING MEDIUM STORING MEASUREMENT PROGRAM

(71) Applicant: FUJITSU LIMITED, Kawasaki (JP)

(72) Inventors: Minoru Hoshina, Kawasaki (JP); Jun Fujisaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/460,372

(22) Filed: Aug. 30, 2021

(65) Prior Publication Data
US 2022/0179014 A1    Jun. 9, 2022

(30) Foreign Application Priority Data
Dec. 7, 2020 (JP) .............................. JP2020-202457

(51) Int. Cl.
G01R 33/00 (2006.01)
G01R 33/12 (2006.01)

(52) U.S. Cl.
CPC ..... *G01R 33/0017* (2013.01); *G01R 33/0005* (2013.01); *G01R 33/0023* (2013.01); *G01R 33/1215* (2013.01)

(58) Field of Classification Search
CPC ............ G01R 33/0017; G01R 33/0005; G01R 33/0023
See application file for complete search history.

(56) References Cited

U.S. PATENT DOCUMENTS

| | | | |
|---|---|---|---|
| 2012/0046888 A1* | 2/2012 | Shimizu | G01R 33/00 702/57 |
| 2014/0046608 A1 | 2/2014 | Natsumeda | |
| 2016/0196372 A1* | 7/2016 | Fujisaki | G06F 30/20 703/2 |
| 2017/0278602 A1* | 9/2017 | Iwasa | H01F 1/053 |
| 2019/0377033 A1* | 12/2019 | Fujisaki | G01R 33/0023 |

FOREIGN PATENT DOCUMENTS

| | | |
|---|---|---|
| JP | S50-075465 A | 6/1975 |
| WO | 2012/157637 A1 | 11/2012 |

* cited by examiner

*Primary Examiner* — Alvaro E Fortich
(74) *Attorney, Agent, or Firm* — Fujitsu Patent Center

(57) ABSTRACT

A measurement apparatus includes: a memory; and a processor coupled to the memory and configured to: acquire, for each of two samples which are objects made of a same material, have different sizes, and have similar shapes, magnetization curve data measured for the sample and a shape parameter including a dimension of the sample; calculate magnetization of an inner part of each of the samples based on the acquired magnetization curve data and shape parameter of the sample by using a model representing magnetization of the object by separating the magnetization of the object into a magnetization component of a surface part and a magnetization component of an inner part of the object in accordance with a volume ratio between the surface part and the inner part of the object; and output the calculated result.

8 Claims, 17 Drawing Sheets

FIG. 5

SHAPE-SPECIFIC FUNCTION TABLE ~230

| SHAPE | FUNCTION |
|---|---|
| CUBOID (CUBE) | $J_{bulk}(H) = \dfrac{L1(H)J1(H) - L2(H)J2(H)}{L1(H) - L2(H)}$ |
| CUBOID (OTHER THAN CUBE) | $J_{bulk}(H) = \dfrac{L1(H) - kJ2(H)}{1 - k}$ |
| ELLIPTICAL SPHERE (PERFECT CIRCULAR SPHERE) | $J_{bulk}(H) = \dfrac{r1J1(H) - r2J2(H)}{r1 - r2}$ |
| ELLIPTICAL SPHERE (OTHER THAN PERFECT CIRCULAR SPHERE) | $J_{bulk}(H) = \dfrac{J1(H) - lJ2(H)}{1 - l}$ |
| ELLIPTICAL CYLINDER | $J_{bulk}(H) = \dfrac{h1J1(H) - h2J2(H)}{h1 - h2}$ |

500-1, 500-2, 500-3, 500-4, 500-5

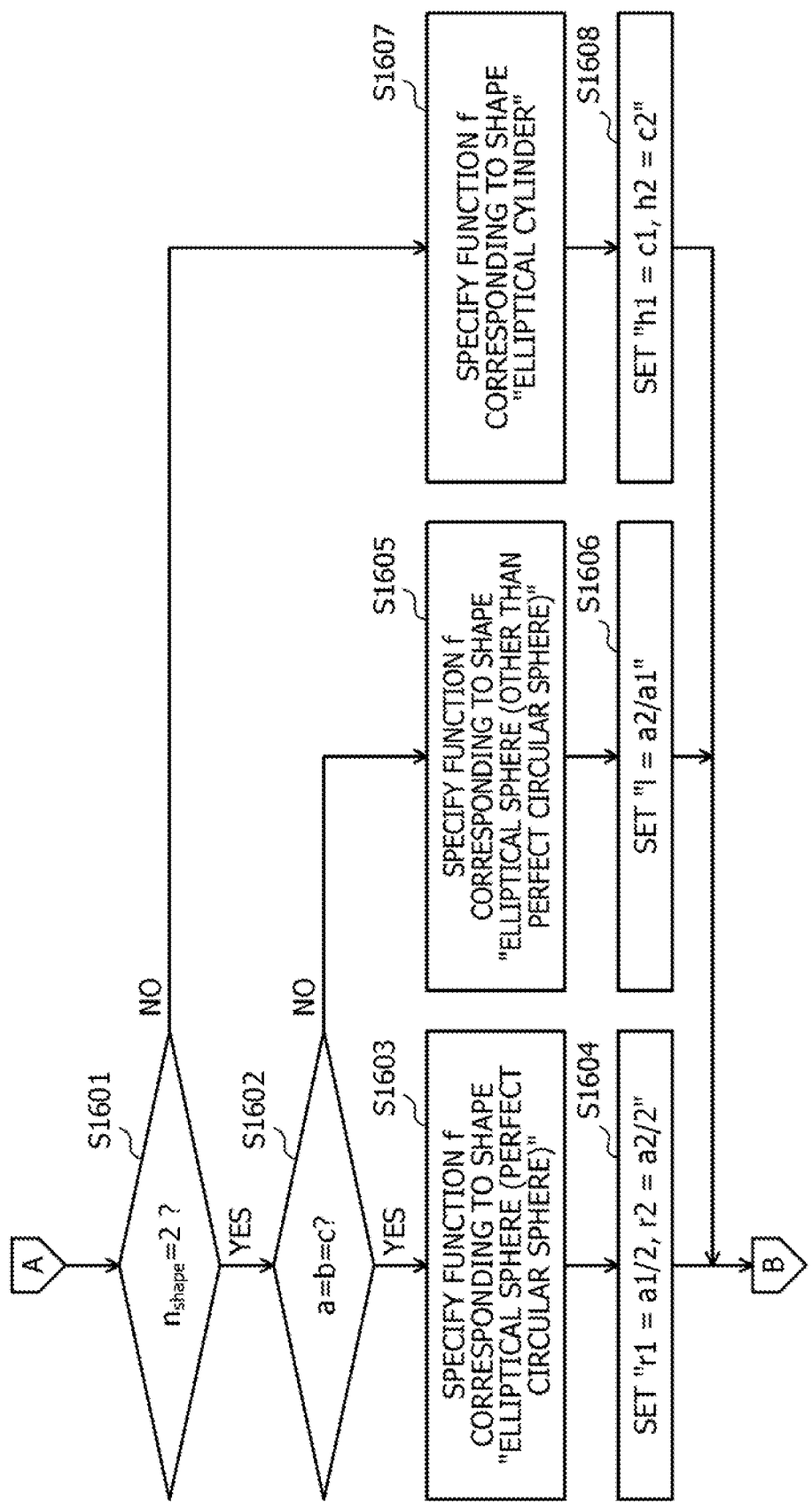

MEASUREMENT APPARATUS, MEASUREMENT METHOD, AND COMPUTER-READABLE RECORDING MEDIUM STORING MEASUREMENT PROGRAM

CROSS-REFERENCE TO RELATED APPLICATION

This application is based upon and claims the benefit of priority of the prior Japanese Patent Application No. 2020-202457, filed on Dec. 7, 2020, the entire contents of which are incorporated herein by reference.

FIELD

The embodiments discussed herein are related to a measurement apparatus, a measurement method, and a computer-readable recording medium storing measurement program.

BACKGROUND

In the related art, permanent magnets have been used in various industrial products such as motors, wind turbines, and devices. The permanent magnet has a physical quantity called magnetization, and the magnetization changes when an external magnetic field is applied. It is also known that magnetic characteristics of a surface of the permanent magnet change (surface deterioration) during machining.

International Publication Pamphlet No. WO 2012/157637 is disclosed as related art. Japanese Laid-open Patent Publication No. 50-75465 is disclosed as related art.

SUMMARY

According to an aspect of the embodiments, a measurement apparatus includes: a memory; and a processor coupled to the memory and configured to: acquire, for each of two samples which are objects made of a same material, have different sizes, and have similar shapes, magnetization curve data measured for the sample and a shape parameter including a dimension of the sample; calculate magnetization of an inner part of each of the samples based on the acquired magnetization curve data and shape parameter of the sample by using a model representing magnetization of the object by separating the magnetization of the object into a magnetization component of a surface part and a magnetization component of an inner part of the object in accordance with a volume ratio between the surface part and the inner part of the object; and output the calculated result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is an explanatory diagram illustrating an example of stored contents of a shape-specific function table;

FIG. 16 is a flowchart (part 2) illustrating an example of the correction processing procedure of the information processing apparatus.

DESCRIPTION OF EMBODIMENTS

For example, there is a technique for calculating a J-H curve by using a distribution of ΔHcJ (the amount of increase in coercivity) in the magnet and calculating a demagnetizing factor at a predetermined temperature by using a temperature coefficient. There is a technique for measuring magnetic characteristic values Br and BHC without drawing a magnetic hysteresis curve by measuring residual magnetic flux values of two or more permanent magnets having different permeance coefficients and having the same quality.

However, it may be difficult to accurately measure the characteristics of the permanent magnet. For example, when the characteristics of the permanent magnet are measured, the smaller a sample size, the larger a measurement error due to the influence of the surface deterioration, and the characteristics of the permanent magnet may not be accurately measured.

In one aspect, characteristics of a permanent magnet may be measured accurately.

Hereinafter, embodiments of a measurement apparatus, a measurement method, and a measurement program according to the present disclosure will be described in detail with reference to the drawings.

Embodiments

Figure 1:
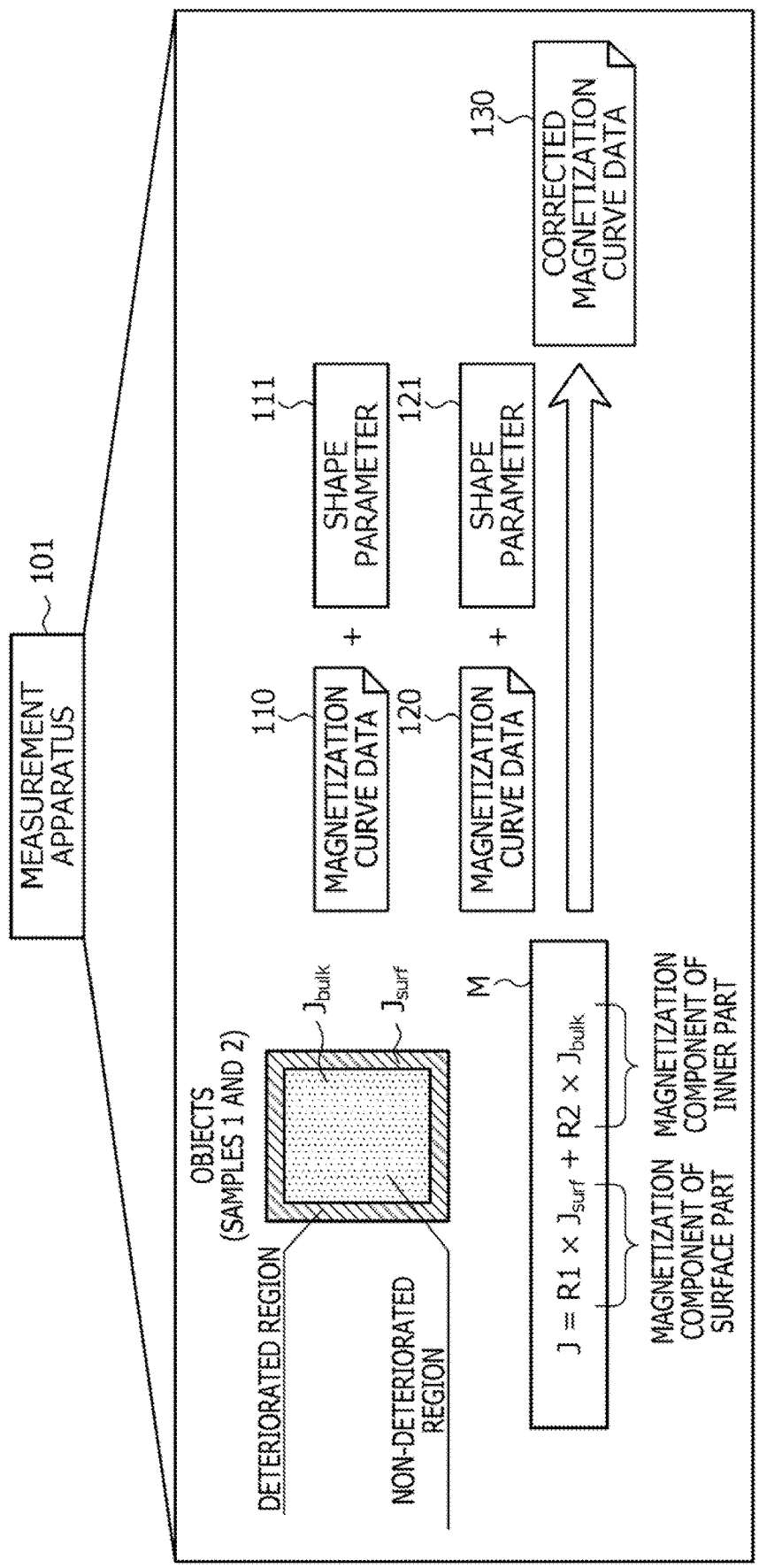
FIG. 1 is an explanatory diagram illustrating an example of a measurement method according to an embodiment.

FIG. 1 is an explanatory diagram illustrating an example of a measurement method according to the embodiment. In FIG. 1, a measurement apparatus 101 is a computer that measures magnetization of a permanent magnet. The permanent magnet is an object that continues to maintain properties as a magnet for a relatively long period of time without being supplied with an external magnetic field or the like. The magnetization of the permanent magnet changes when the external magnetic field (magnetic field) is applied. Examples of a material of the permanent magnet include iron, cobalt, nickel, samarium, neodymium, and the like.

The magnetization is one of physical quantities representing characteristics of the permanent magnet. The magnetization is a phenomenon in which an object (magnetic body) is magnetically polarized to become a magnet when an external magnetic field is applied to the object, and represents a degree of magnetization of the object. It is important to accurately measure the magnetization of the permanent magnet, for example, in order to determine the permanent magnet used in an industrial product.

On the other hand, it is known that small cracks are caused on a surface of the permanent magnet during machining and magnetic characteristics of the surface change (surface deterioration). Due to the influence of the surface deterioration, a measurement error such as a level difference may be caused in measurement data of a magnetization curve of the permanent magnet. Since the smaller the sample size, the relatively larger the influence of the error due to the surface deterioration, the measurement error becomes remarkable when the sample size is small.

In order to reduce the measurement error, it is considered to increase the size of the sample. However, the size of the sample has to be reduced depending on a measurement type. For example, in an open magnetic circuit type, since magnetization is measured by applying a magnetic field to a sample placed between coils while vibrating the sample, the sample size has to be reduced.

For example, in a case where the magnetization is measured by the open magnetic circuit type, the size of the sample has to be reduced due to conditions of the measurement type. The influence of the error due to the surface deterioration becomes relatively large, and thus, the measurement error becomes large. However, in the related art, the measurement error may not be removed when the characteristics of the permanent magnet are measured.

Thus, in the present embodiment, a measurement method capable of accurately measuring the characteristics of the permanent magnet by removing the measurement error due to the influence of the surface deterioration from the magnetization curve data measured by the open magnetic circuit type or the like will be described. A processing example of the measurement apparatus 101 will be described.

(1) The measurement apparatus 101 acquires, for each of two samples which are objects made of the same material, have different sizes, and have similar shapes, magnetization curve data measured for the sample and a shape parameter indicating a dimension of the sample. The sample is a material used for measuring the magnetization (sample of the permanent magnet to be measured). The two samples are, for example, samples machined by the same method (cutting, polishing, or the like).

The magnetization curve data is information indicating a relationship between the external magnetic field and the magnetization. The magnetization curve data of the sample indicates a relationship between the magnetic field applied to the sample and the magnetization of the sample. The dimensions of the sample are, for example, a length of a side of the sample, a size of a diameter, and the like. The acquired magnetization curve data indicates, for example, the magnetization curve measured by the open magnetic circuit type, and includes the measurement error due to the surface deterioration.

In the example of FIG. 1, it is assumed that the two samples which are objects made of the same material, have different sizes, and have similar shapes are "samples 1 and 2" and magnetization curve data 110 and a shape parameter 111 of the sample 1 and magnetization curve data 120 and a shape parameter 121 of the sample 2 are acquired. It is assumed that shapes of the samples 1 and 2 are "cube". In this case, the shape parameters 111 and 121 are, for example, pieces of information indicating lengths of sides of the samples 1 and 2.

(2) The measurement apparatus 101 calculates magnetization of an inner part of each of the two samples based on the acquired magnetization curve data and shape parameter of the sample by using a model M. The model M is information representing the magnetization of the object by separating the magnetization of the object into a magnetization component of a surface part and a magnetization component of an inner part of the object in accordance with a volume ratio between the surface part and the inner part of the object.

The object is the permanent magnet (for example, the sample 1 or 2) to be measured for the magnetization. The surface part of the object indicates a deteriorated region of a surface of the object (in which magnetization characteristics change). The inner part of the object is a part other than the surface part of the object, and indicates a non-deteriorated region inside the object. When methods for machining the two samples are the same, it may be said that degrees of surface deterioration are the same between the samples.

The smaller the sample size, the relatively larger the influence of the error due to the surface deterioration. For example, the influence of the error due to the surface deterioration changes depending on a ratio of the surface part to the entire sample. The magnetization of the entire sample is represented by the sum of the magnetization of the deteriorated region on the sample surface and the magnetization of the non-deteriorated region inside the sample in consideration of a volume ratio between a surface part and an inner part of the sample.

In the example of FIG. 1, it is assumed that the magnetization of the entire object is "J", the magnetization of the surface part of the object is "$J_{surf}$", and the magnetization of the inner part of the object is "$J_{bulk}$". It is assumed that the model M is "$J=R1 \times J_{surf}+R2 \times J_{bulk}$". R1 indicates a ratio of a volume of the surface part to the entire object. R2 indicates a ratio of a volume of the inner part to the entire object. For example, R1 and R2 correspond to the volume ratios between the surface part and the inner part of the object (sample 1 or 2).

In this case, the measurement apparatus 101 calculates the magnetization $J_{bulk}$ of the inner part of the sample by removing the magnetization $J_{surf}$ of the surface part of the sample based on the magnetization curve data 110 or 120 and the shape parameter 111 or 121 by using the model M. The magnetization $J_{bulk}$ of the inner part of the sample corresponds to magnetization in which the measurement error due to the surface deterioration is removed from the magnetization curve data 110 or 120.

For example, the measurement apparatus 101 establishes, for each of the samples 1 and 2, an equation representing the magnetization of the entire sample 1 or 2 by separating the magnetization into the magnetization component of the surface part and the magnetization component of the inner part by using the model M. Subsequently, the measurement apparatus 101 derives a function representing the magnetization of the inner part of the sample from the magnetization and the dimension of each of the two samples (samples 1 and 2) by solving simultaneous equations including two equations.

The measurement apparatus 101 calculates the magnetization $J_{bulk}$ of the inner part of each of the samples (samples 1 and 2) based on the magnetization curve data 110 or 120 and the shape parameter 111 or 121 of the sample 1 or 2 by using the derived function. The magnetization $J_{bulk}$ is calculated for various magnetic fields, and thus, the magnetization curve data in which the measurement error due to the surface deterioration is removed may be obtained. The function representing the magnetization of the inner part of the sample may be created in advance from the magnetization and the dimension of each of the two samples (samples 1 and 2).

(3) The measurement apparatus 101 outputs the calculated result. For example, the measurement apparatus 101 outputs the magnetization curve data indicating the calculated magnetization of the inner part of the sample (sample 1 or 2), as corrected magnetization curve data in which the measurement error due to the influence of the surface deterioration is removed.

In the example of FIG. 1, the magnetization curve data indicating the magnetization $J_{bulk}$ of the inner part of the sample (sample 1 or 2) is output as corrected magnetization curve data 130.

As described above, according to the measurement apparatus 101, the pieces of magnetization curve data of the two samples which are made of the same material, have different sizes, and have similar shapes are used, and thus, the error (measurement error) such as the level difference due to the influence of the surface deterioration which appears markedly by using the sample having the smaller size may be correctly compensated for.

In the example of FIG. 1, when the characteristics of the permanent magnet are measured, even in a case where the sizes of the samples 1 and 2 are small, the corrected magnetization curve data 130 in which the measurement error due to the influence of the surface deterioration is removed may be obtained from the pieces of magnetization curve data 110 and 120 of the samples 1 and 2. According to the corrected magnetization curve data 130, the characteristics of the permanent magnet may be accurately determined.

(System Configuration Example of Information Processing System 200)

Next, a system configuration example of an information processing system 200 including the measurement apparatus 101 illustrated in FIG. 1 will be described. A case where the measurement apparatus 101 illustrated in FIG. 1 is applied to an information processing apparatus 201 in the information processing system 200 will be described as an example. The information processing system 200 is applied to, for example, a service of correcting the measurement error due to the influence of the surface deterioration in the magnetization curve of the permanent magnet.

Figure 2:
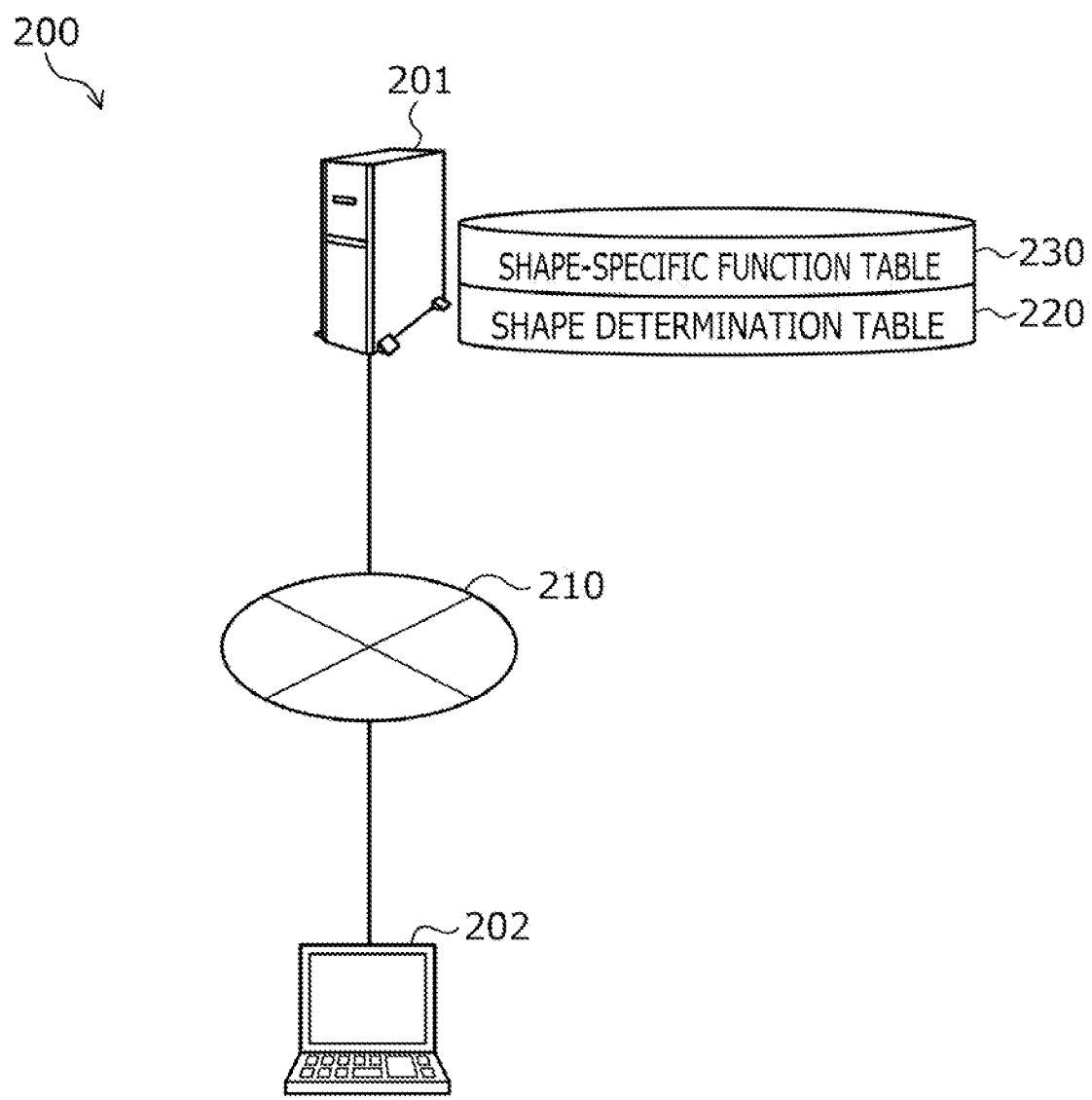
FIG. 2 is an explanatory diagram illustrating a system configuration example of an information processing system.

FIG. 2 is an explanatory diagram illustrating the system configuration example of the information processing system 200. In FIG. 2, the information processing system 200 includes the information processing apparatus 201 and a client apparatus 202. In the information processing system 200, the information processing apparatus 201 and the client apparatus 202 are coupled to each other via a wired or wireless network 210. The network 210 is, for example, the Internet, a local area network (LAN), a wide area network (WAN), or the like.

The information processing apparatus 201 includes a shape determination table 220 and a shape-specific function table 230, and measures the characteristics of the permanent magnet. The information processing apparatus 201 is, for example, a server. Stored contents of the shape determination table 220 and the shape-specific function table 230 will be described later with reference to FIGS. 4 and 5.

The client apparatus 202 is a computer used by a user of the information processing system 200. The user is, for example, a designer of the permanent magnet, a designer of the industrial product using the permanent magnet, or the like. The client apparatus 202 is, for example, a personal computer (PC), a tablet PC, or the like.

Although the information processing apparatus 201 and the client apparatus 202 are separately provided, the present disclosure is not limited thereto. For example, the information processing apparatus 201 may be realized by the client apparatus 202. The information processing system 200 may include a plurality of client apparatuses 202.

(Hardware Configuration Example of Information Processing Apparatus 201)

Figure 3:
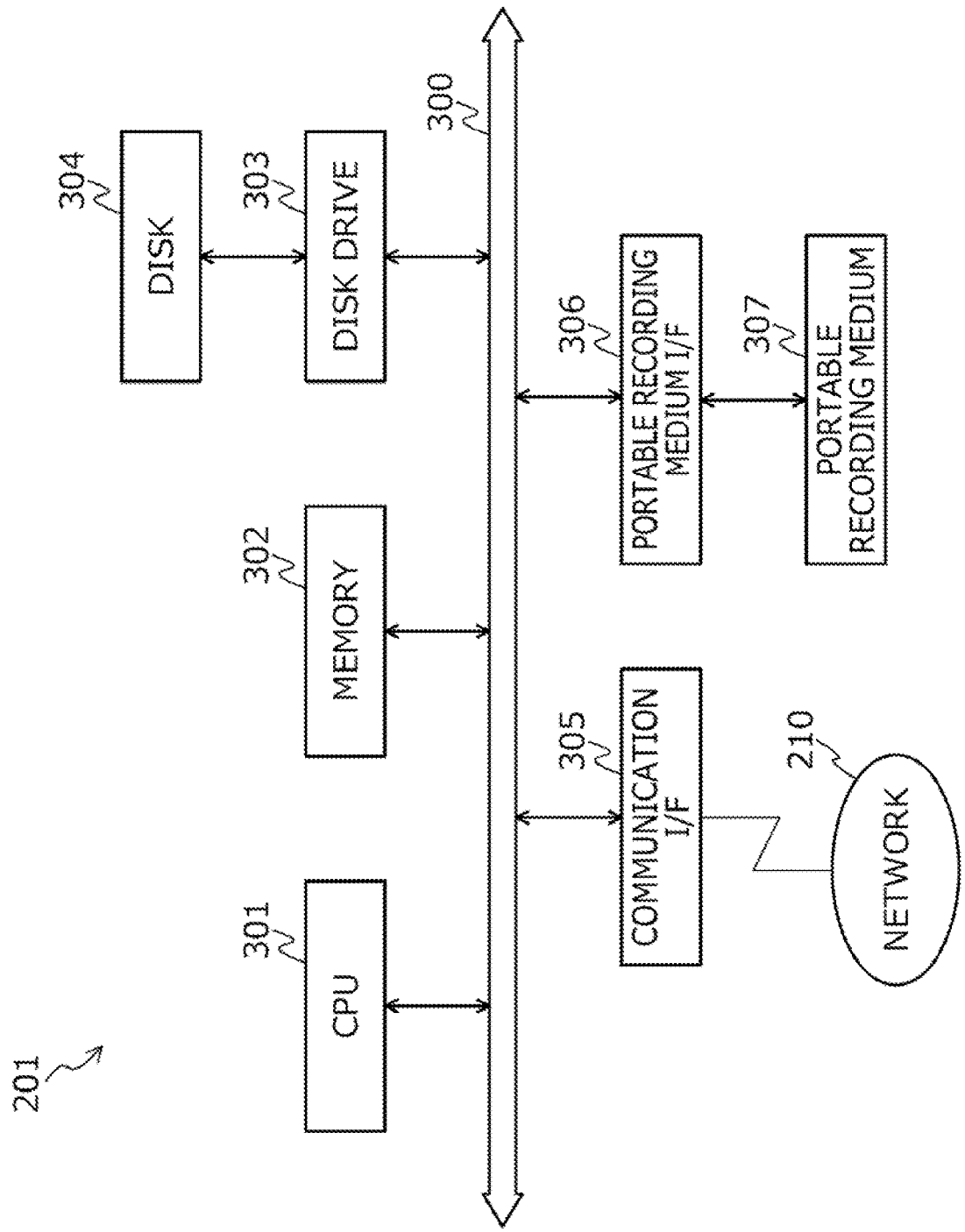
FIG. 3 is a block diagram illustrating a hardware configuration example of an information processing apparatus.

FIG. 3 is a block diagram illustrating a hardware configuration example of the information processing apparatus 201. In FIG. 3, the information processing apparatus 201 has a central processing unit (CPU) 301, a memory 302, a disk drive 303, a disk 304, a communication interface (I/F) 305, a portable recording medium I/F 306, and a portable recording medium 307. These components are coupled to one another through a bus 300.

The CPU 301 controls the entirety of the information processing apparatus 201. The CPU 301 may include multiple cores. The memory 302 includes, for example, a read-only memory (ROM), a random-access memory (RAM), a flash ROM, and the like. For example, the flash ROM stores a program of an OS, the ROM stores application programs, and the RAM is used as a work area of the CPU 301. The program stored in the memory 302 is loaded by the CPU 301, thereby causing the CPU 301 to execute coded processing.

The disk drive 303 controls reading and writing of data from and to the disk 304 in accordance with the control of the CPU 301. The disk 304 stores the data written under the control of the disk drive 303. Examples of the disk 304 include a magnetic disk, an optical disk, and the like.

The communication I/F 305 is coupled to the network 210 via a communication line, and is coupled to an external computer (for example, the client apparatus 202 illustrated in FIG. 2) via the network 210. The communication I/F 305 functions as an interface between the network 210 and the inside of the apparatus, and controls input and output of data to and from the external computer. As the communication I/F 305, for example, a modem, a LAN adapter, or the like may be adopted.

The portable recording medium I/F 306 controls reading and writing of data from and to the portable recording medium 307 in accordance with the control of the CPU 301. The portable recording medium 307 stores the data written under the control of the portable recording medium I/F 306. Examples of the portable recording medium 307 include a compact disc read-only memory (CD-ROM), a Digital Versatile Disk (DVD), a Universal Serial Bus (USB) memory, and the like.

The information processing apparatus 201 may include, for example, an input device, a display, and the like in addition to the above-described components. The client apparatus 202 illustrated in FIG. 2 may also be realized by a hardware configuration similar to the hardware configuration of the information processing apparatus 201. However, the client apparatus 202 includes an input device, a display, and the like in addition to the above-described components.

(Stored Contents of Various Tables 220 and 230)

Next, the stored contents of the shape determination table 220 and the shape-specific function table 230 included in the information processing apparatus 201 will be described with reference to FIGS. 4 and 5. The shape determination table 220 and the shape-specific function table 230 are realized by, for example, storage devices such as the memory 302 and the disk 304 illustrated in FIG. 3.

Figure 4:
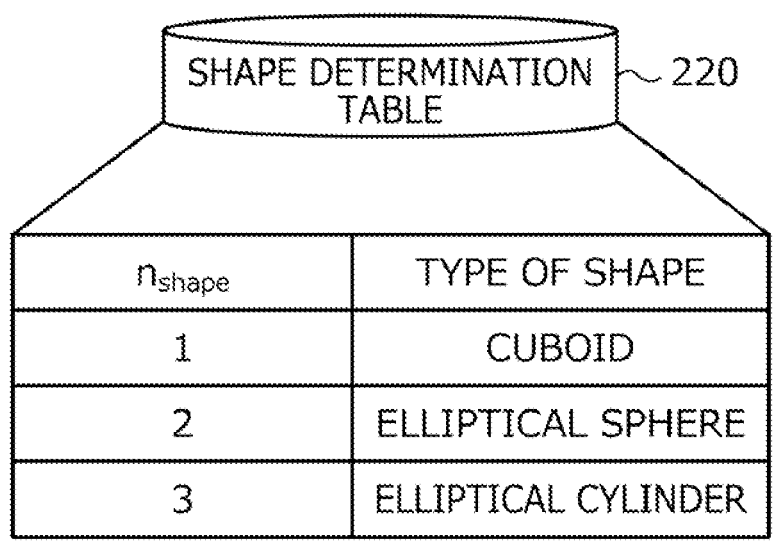
FIG. 4 is an explanatory diagram illustrating an example of stored contents of a shape determination table.

FIG. 4 is an explanatory diagram illustrating an example of the stored contents of the shape determination table 220. In FIG. 4, the shape determination table 220 indicates a correspondence between $n_{shape}$ and a type of a shape. $n_{shape}$ indicates the type of the shape of the sample. $n_{shape}$ is represented by 1, 2, or 3. $n_{shape}$ "1" indicates a cuboid. $n_{shape}$ "2" indicates an elliptical sphere. $n_{shape}$ "3" indicates an elliptical cylinder.

FIG. 5 is an explanatory diagram illustrating an example of the stored contents of the shape-specific function table 230. In FIG. 5, the shape-specific function table 230 has fields of the shape and the function, and stores pieces of shape-specific function information 500-1 to 500-5 as records by setting information in each field.

The shape is the shape of the sample. A cuboid (cube), a cuboid (other than the cube), an elliptical sphere (perfect circular sphere), an elliptical sphere (other than the perfect circular sphere), and an elliptical cylinder are set as the shape. The function is a function used when the magnetization curve data of the sample having the corresponding shape is corrected. Each function will be described in detail later.

(Specific Examples of Magnetization Curve Data)

Next, specific examples of the pieces of magnetization curve data of the samples S1 and S2 will be described with reference to FIGS. 6A and 6B. In the following description, the samples S1 and S2 are objects (permanent magnets) which are made of the same material, have different sizes, and have similar shapes. The samples S1 and S2 are samples machined by the same method (cutting, polishing, or the like).

Figure 6A:
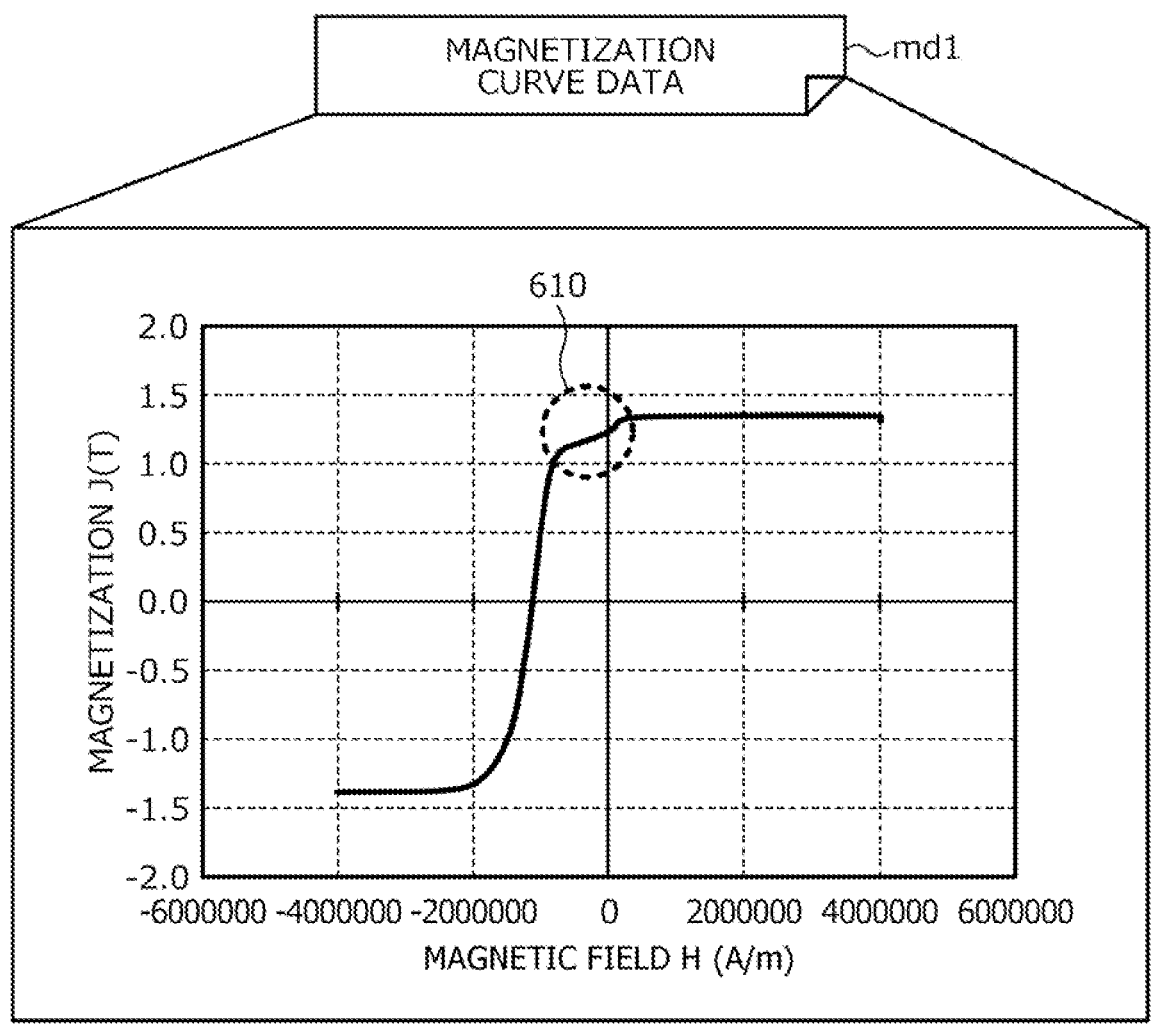
FIG. 6A is an explanatory diagram (part 1) illustrating a specific example of magnetization curve data.

FIG. 6A is an explanatory diagram (part 1) illustrating the specific example of the magnetization curve data. In FIG. 6A, magnetization curve data md1 is information indicating magnetization J (T) of the sample S1 measured by the open magnetic circuit type, and indicates a relationship between a magnetic field H (A/m) applied to the sample S1 and the magnetization J (T) of the sample S1. In the magnetization curve data md1, the measurement error such as the level difference is caused in a portion of a dotted line frame 610.

Figure 6B:
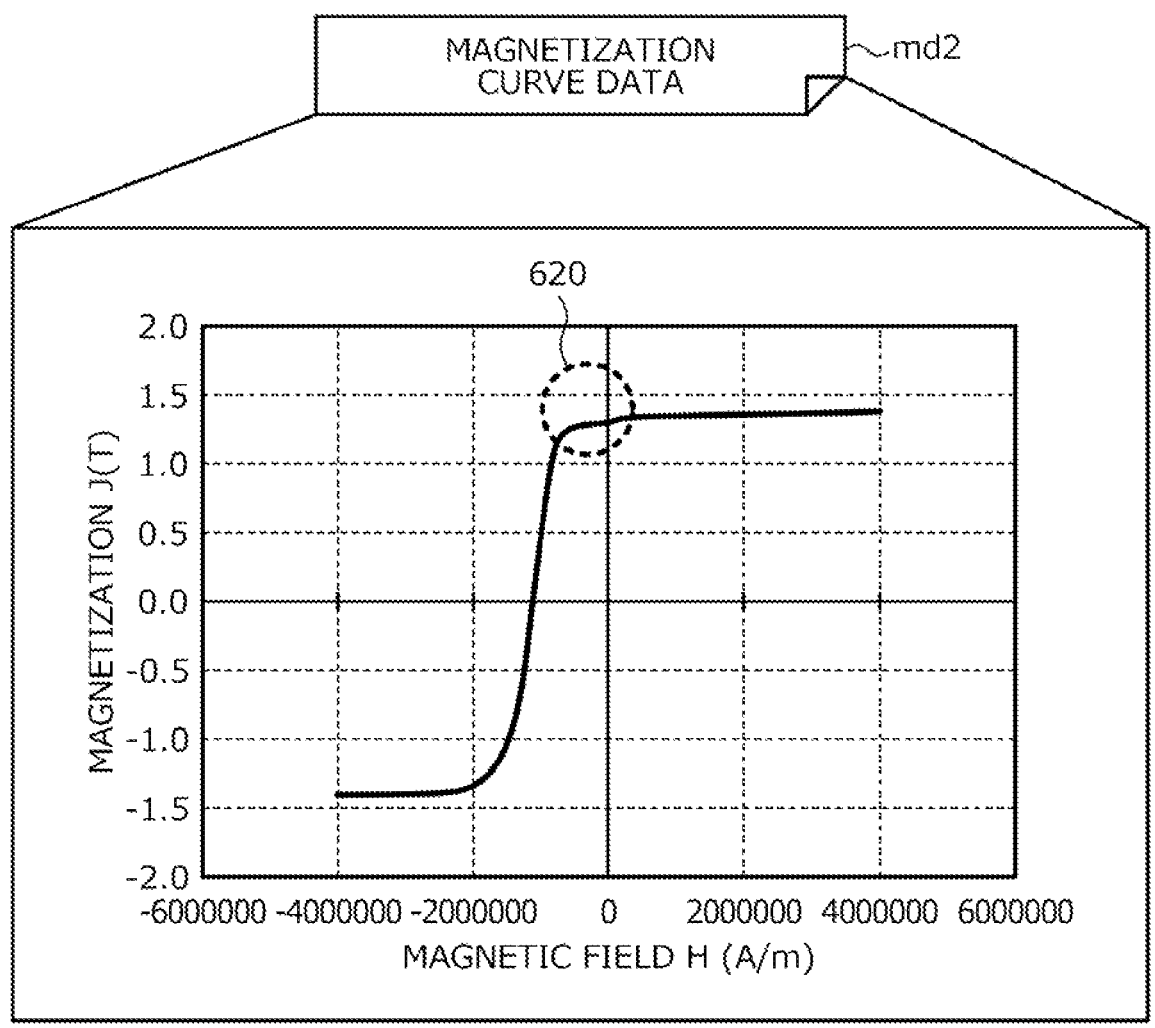
FIG. 6B is an explanatory diagram (part 2) illustrating a specific example of the magnetization curve data.

FIG. 6B is an explanatory diagram (part 2) illustrating the specific example of the magnetization curve data. In FIG. 66, magnetization curve data md2 is information indicating magnetization J (T) of the sample S2 measured by the open magnetic circuit type, and indicates a relationship between a magnetic field H (A/m) applied to the sample S2 and the magnetization J (T) of the sample S2. Although the magnetization curve data md2 is smaller than the magnetization curve data md1, the measurement error such as the level difference is caused in a portion of a dotted line frame 620.

In the open magnetic circuit type, since the sample is stably vibrated, the shape of the sample is limited. For example, the cuboid, the elliptical sphere, the elliptical cylinder, or the like is used as the shapes of the samples S1 and S2.

(Specific Examples of Shape Parameter)

Next, specific examples of the pieces of magnetization curve data of the samples S1 and S2 will be described with reference to FIGS. 7A and 7B.

Figure 7A:
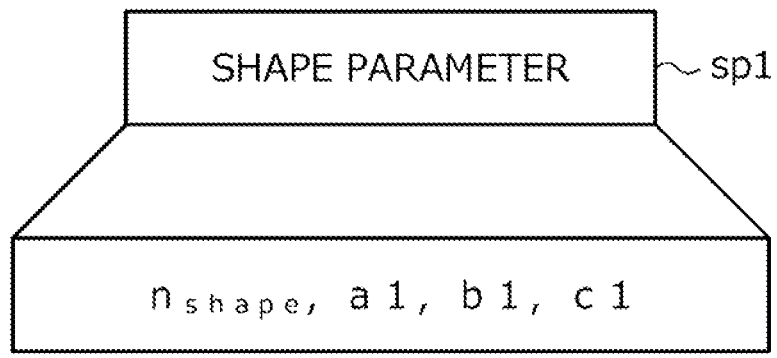
FIG. 7A is an explanatory diagram (part 1) illustrating a specific example of a shape parameter.

FIG. 7A is an explanatory diagram (part 1) illustrating the specific example of the shape parameter. In FIG. 7A, a shape parameter sp1 includes $n_{shape}$, a1, b1, and c1. $n_{shape}$ indicates the type of the shape of the sample S1. $n_{shape}$ is represented by 1, 2, or 3. a1, b1, and c1 indicate dimensions of the sample S1.

Dimensions of parts of the sample S1 indicated by the parameters a1, b1, and c1 are defined in advance in accordance with the type ($n_{shape}$) of the shape of the sample S1. A definition example of the parameters indicating the dimensions will be described later with reference to FIG. 8.

Figure 7B:
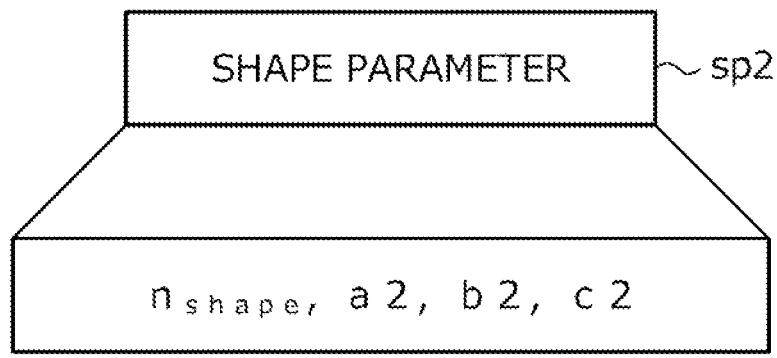
FIG. 7B is an explanatory diagram (part 2) illustrating a specific example of the shape parameter.

FIG. 7B is an explanatory diagram (part 2) illustrating the specific example of the shape parameter. In FIG. 7B, a shape parameter sp2 includes $n_{shape}$, a2, b2, and c2. $n_{shape}$ indicates the type of the shape of the sample S2. $n_{shape}$ is represented by 1, 2, or 3. Since the samples S1 and S2 have similar shapes, the types $n_{shape}$ are the same.

a2, b2, and c2 indicate dimensions of the sample S2. Dimensions of parts of the sample S2 indicated by the parameters a2, b2, and c2 are defined in advance in accordance with the type ($n_{shape}$) of the shape of the sample S2. A definition example of the parameters indicating the dimensions will be described with reference to FIG. 8.

Figure 8:
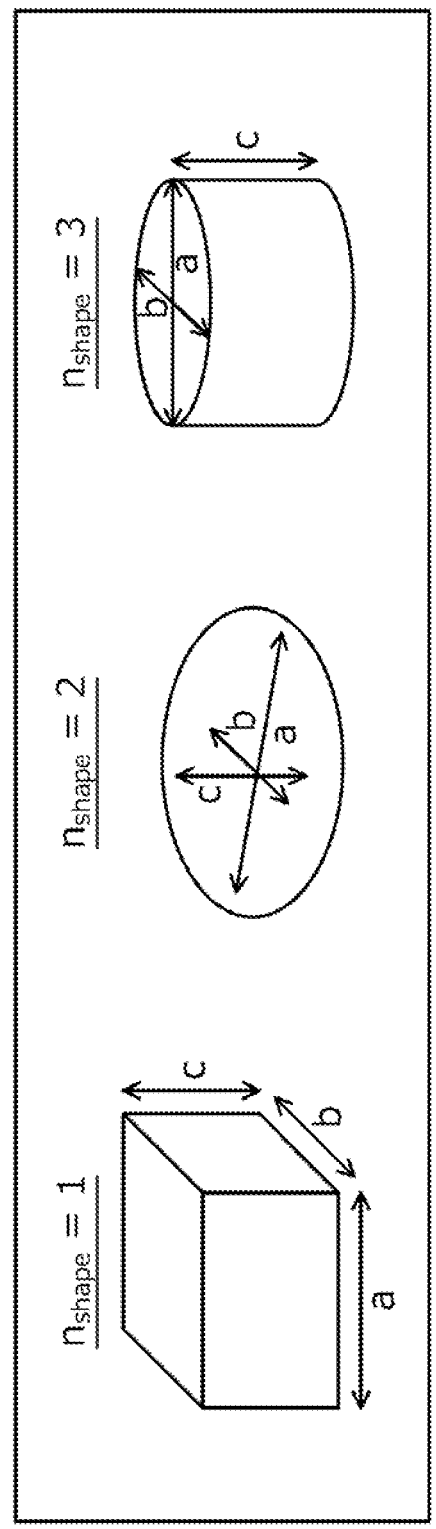
FIG. 8 is an explanatory diagram illustrating a definition example of a parameter indicating a dimension.

FIG. 8 is an explanatory diagram illustrating the definition example of the parameters indicating the dimensions. In FIG. 8, first, a definition example of a parameter indicating a dimension in a case where $n_{shape}$ is "1" will be described. $n_{shape}$ "1" indicates a cuboid. In a case where $n_{shape}$ is "1", a indicates a dimension of a width. b indicates a dimension of a depth. c indicates a dimension of a height.

Next, a definition example of a parameter indicating a dimension in a case where $n_{shape}$ is "2" will be described. $n_{shape}$ "2" indicates an elliptical sphere. In a case where $n_{shape}$ is "2", a indicates a dimension of a major axis of an ellipse that is a cross section of the elliptical sphere. b indicates a dimension of a minor axis of the ellipse that is the cross section of the elliptical sphere. c indicates a dimension of a height of the elliptical sphere.

Next, a definition example of a parameter indicating a dimension in a case where $n_{shape}$ is "3" will be described. $n_{shape}$ "3" indicates an elliptical cylinder. In a case where $n_{shape}$ is "3", a indicates a dimension of a major axis of an ellipse that is a cross section of the elliptical cylinder. b indicates a dimension of a minor axis of the ellipse that is the cross section of the elliptical cylinder. c indicates a dimension of a height of the elliptical cylinder.

(Functional Configuration Example of Information Processing Apparatus 201)

Figure 9:
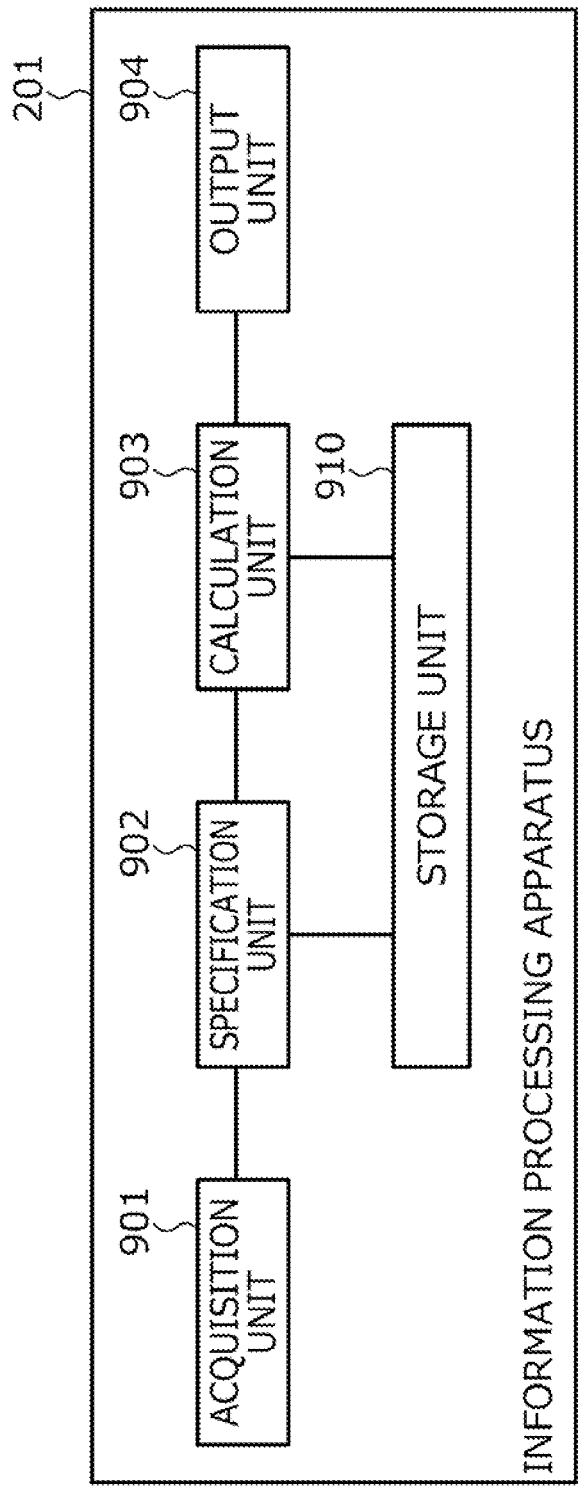
FIG. 9 is a block diagram illustrating a functional configuration example of the information processing apparatus.

FIG. 9 is a block diagram illustrating a functional configuration example of the information processing apparatus 201. In FIG. 9, the information processing apparatus 201 includes an acquisition unit 901, a specification unit 902, a calculation unit 903, an output unit 904, and a storage unit 910. The acquisition unit 901 to the output unit 904 are functions constituting a control unit, and realize the functions by, for example, causing the CPU 301 to execute programs stored in the storage devices such as the memory 302, the disk 304, and the portable recording medium 307 illustrated in FIG. 3 or by using the communication I/F 305. The processing result obtained by each functional unit is stored, for example, in the storage device such as the memory 302 or the disk 304. The storage unit 910 is realized by the storage device such as the memory 302 or the disk 304. For example, the storage unit 910 stores the shape determination table 220 illustrated in FIG. 4 and the shape-specific function table 230 illustrated in FIG. 5.

The acquisition unit 901 acquires the measured magnetization curve data and the shape parameter for each of the samples S1 and S2. The samples S1 and S2 are samples of the permanent magnets to be measured for the magnetization, are two samples which are objects made of the same material, have different sizes, and have similar shapes. The samples S1 and S2 are samples machined by the same method (cutting, polishing, or the like). The size of the sample S1 is smaller than the size of the sample S2. The samples S1 and S2 are samples having sizes of several mm or less.

The magnetization curve data is information indicating a relationship between the external magnetic field and the magnetization. The magnetization curve data indicates, for example, the magnetization curve (the curve representing the magnetization that changes in accordance with the external magnetic field) measured by the open magnetic circuit type. Since the sizes of the samples (samples S1 and S2) are small, the measurement errors due to the influence of the surface deterioration are included in the pieces of measured magnetization curve data.

The shape parameter includes the dimensions of the samples (samples S1 and S2). The shape parameter may include, for example, the parameter (for example, $n_{shape}$) representing the type of the shape of the sample (sample S1 or S2). The dimension included in the shape parameter is determined, for example, by the type of the shape of the sample (sample S1 or S2).

For example, the acquisition unit 901 receives the pieces of magnetization curve data md1 and md2 illustrated in FIGS. 6A and 66 and the shape parameters sp1 and sp2 illustrated in FIGS. 7A and 7B from the client apparatus 202 illustrated in FIG. 2. Accordingly, the magnetization curve data (magnetization curve data md1 or md2) and the shape parameter (shape parameter sp1 or sp2) of each of the samples S1 and S2 are acquired.

The acquisition unit 901 may acquire the magnetization curve data (magnetization curve data md1 or md2) and the shape parameter (shape parameter sp1 or sp2) of each of the samples S1 and S2 in accordance with an operation input by the user using the input device (not illustrated).

The specification unit 902 specifies the shapes of the samples (samples S1 and S2) based on the acquired shape parameters. For example, first, the specification unit 902 specifies the types of the shapes of the samples (samples S1 and S2) based on the types $n_{shape}$ included in the shape parameters sp1 and sp2 while referring to the shape determination table 220 illustrated in FIG. 4. The specification unit 902 specifies the shapes of the samples (samples S1 and S2) based on the specified types of the shapes while referring to the dimensions included in the shape parameters sp1 and sp2.

In a case where values of $n_{shape}$ included in the shape parameters sp1 and sp2 do not match, the types of the shapes of the samples S1 and S2 are different. In this case, for example, the information processing apparatus 201 may output an error indicating that the samples S1 and S2 do not have similar shapes.

For example, it is assumed that "cuboid" is specified as the types of the shapes of the samples (samples S1 and S2) ($n_{shape}$=1). In this case, the specification unit 902 determines whether or not "a=b=c" while referring to the dimensions included in the shape parameters sp1 and sp2. For example, the specification unit 902 determines whether or not "a1=b1=c1" while referring to the dimensions a1, b1, and c1 included in the shape parameter sp1. The specification unit 902 determines whether or not "a2=b2=c2" while referring to the dimensions a2, b2, and c2 included in the shape parameter sp2. However, since the samples S1 and S2 have similar shapes, only one of "a1=b1=c1" and "a2=b2=c2" may be determined. In the case of "a=b=c", the specification unit 902 specifies the shapes of the samples (samples S1 and S2) as "cube". On the other hand, in a case where "a=b=c" is not established, the specification unit 902 specifies the shapes of the samples (samples S1 and S2) as "cuboid other than cube".

It is assumed that "elliptical sphere" is specified as the types of the shapes of the samples (samples S1 and S2) ($n_{shape}$=2). In this case, the specification unit 902 determines whether or not "a=b=c" while referring to the dimensions included in the shape parameters sp1 and sp2. In the case of "a=b=c", the specification unit 902 specifies the shapes of the samples (samples S1 and S2) as a "perfect circular sphere". On the other hand, in a case where "a=b=c" is not established, the specification unit 902 specifies the shapes of the samples (samples S1 and S2) as "elliptical sphere other than perfect circular sphere".

It is assumed that "elliptical cylinder" is specified as the types of the shapes of the samples (samples S1 and S2) ($n_{shape}$=3). In this case, the specification unit 902 specifies the shapes of the samples (samples S1 and S2) as "elliptical cylinder".

As an example, it is assumed that values of various parameters included in the shape parameters sp1 and sp2 are "$n_{shape}$=1, a1=1 [mm], c1=1 [mm], c1=1 [mm], a2=4 [mm], b2=4 [mm], c2=4 [mm]". In this case, since the type of the shape is "cuboid" and "a=b=c" is established, the shapes of the samples (samples S1 and S2) are "cube".

It is assumed that values of various parameters included in the shape parameters sp1 and sp2 are "$n_{shape}$=1, a1=2 [mm], b1=1.5 [mm], c1=1 [mm], a2=4 [mm], b2=3 [mm], c2=2 [mm]". In this case, since the type of the shape is "cuboid" and "a=b=c" is not established, the shapes of the samples (samples S1 and S2) are "cuboid other than cube".

It is assumed that values of various parameters included in the shape parameters sp1 and sp2 are "$n_{shape}$=2, a1=2 [mm], b1=2 [mm], c1=2 [mm], a2=3 [mm], b2=3 [mm], c2=3 [mm]". In this case, since the type of the shape is "elliptical sphere" and "a=b=c" is established, the shapes of the samples (samples S1 and S2) are "perfect circular sphere".

It is assumed that values of various parameters included in the shape parameters sp1 and sp2 are "$n_{shape}$=2, a1=2 [mm], b1=1 [mm], c1=1 [mm], a2=4 [mm], b2=2 [mm], c2=2 [mm]". In this case, since the type of the shape is "elliptical sphere" and "a=b=c" is not established, the shapes of the samples (samples S1 and S2) are "elliptical sphere other than perfect circular sphere".

It is assumed that values of various parameters included in the shape parameters sp1 and sp2 are "$n_{shape}$=3, a1=1.5 [mm], b1=1 [mm], c1=2 [mm], a2=3 [mm], b2=2 [mm], c2=4 [mm]". In this case, the shapes of the samples (samples S1 and S2) are "elliptical cylinder".

The calculation unit 903 calculates the magnetization of the inner part of each of the samples based on the acquired magnetization curve data and shape parameter of the sample (sample S1 or S2) by using the model M. The model M is information representing the magnetization of the object by separating the magnetization of the object into a magnetization component of a surface part and a magnetization component of an inner part of the object in accordance with a volume ratio between the surface part and the inner part of the object.

The object is the permanent magnet of which the magnetization is to be measured. The surface part of the object indicates a deteriorated region of the sample surface (magnetization characteristics change). The inner part of the object is a part other than the surface part of the object, and indicates a non-deteriorated region inside the sample. The model M is, for example, for each of the plurality of types of shapes of the object.

For example, the calculation unit 903 establishes, for each of the samples (samples S1 and S2), an equation representing the magnetization of the entire sample by separating the magnetization into the magnetization component of the surface part and the magnetization component of the inner part by using the model M. Subsequently, the calculation unit 903 derives a function f by solving simultaneous equations including two equations.

The function f is a function representing the magnetization of the inner part of each of the samples from the magnetization and the dimension of the sample (sample S1 or S2). For example, the function f is a calculation expression in which the magnetization and the dimension of each of the samples (samples S1 and S2) are variables. The calculation unit 903 calculates the magnetization of the inner part of each of the samples based on the magnetization curve data and the shape parameter of the sample (sample S1 or S2) by using the derived function f. However, the function f may be created in advance.

The calculation unit 903 may specify the function f corresponding to the specified shape while referring to the storage unit 910. The storage unit 910 stores, in association with each of a plurality of types of shapes, the function f derived from the model M representing the magnetization of the object by separating the magnetization of the object into the magnetization component of the surface part and the magnetization component of the inner part of the object in accordance with the volume ratio between the surface part and the inner part of the object having the shape. The calculation unit 903 may calculate the magnetization of the inner part of each of the samples based on the magnetization curve data and the shape parameter of the sample (sample S1 or S2) by using the specified function f.

For example, the calculation unit 903 specifies the function f corresponding to the specified shape while referring to the shape-specific function table 230 illustrated in FIG. 5.

For example, it is assumed that "cube" is specified as the shapes of the samples (samples S1 and S2). In this case, the calculation unit 903 specifies the following Equation (1) corresponding to the shape "cuboid (cube)" as the function f while referring to the shape-specific function table 230. The calculation unit 903 calculates magnetization $J_{bulk}(H)$ of the inner part of each of the samples (samples S1 and S2) based on the acquired magnetization curve data md1 or md2 and shape parameter sp1 or sp2 by using the following Equation (1).

$$J_{bulk}(H) = \frac{L1(H)J1(H) - L2(H)J2(H)}{L1(H) - L2(H)} \quad (1)$$

$J_{bulk}(H)$ indicates the magnetization of the inner part of the sample when the magnetic field is H. J1(H) indicates the magnetization of the sample S1 when the magnetic field is H. J2(H) indicates the magnetization of the sample S2 when the magnetic field is H. L1 indicates a parameter corresponding to the dimension a1 of the sample S1. L2 indicates a parameter corresponding to the dimension a2 of the sample S2.

For example, the calculation unit 903 substitutes the dimensions a1 and a2 included in the shape parameters sp1 and sp2 into L1 and L2 of the above Equation (1). The calculation unit 903 calculates the magnetization $J_{bulk}$ by substituting (H, J1) and (H, J2) into J1(H) and J2(H) in the above Equation (1) for each value of the magnetic field H while referring to the pieces of magnetization curve data md1 and md2. Accordingly, the magnetization curve data (H, $J_{bulk}$) indicating the magnetization $J_{bulk}$ for each value of the magnetic field H may be obtained.

It is assumed that "cuboid other than cube" is specified as the shapes of the samples (samples S1 and S2). In this case, the calculation unit 903 specifies the following Equation (2) corresponding to the shape "cuboid (other than cube)" as the function f while referring to the shape-specific function table 230. The calculation unit 903 calculates the magnetization $J_{bulk}(H)$ of the inner part of each of the samples based on the magnetization curve data md1 or md2 and the shape parameter sp1 or sp2 by using the following Equation (2).

$$J_{bulk}(H) = \frac{J1(H) - kJ2(H)}{1 - k} \quad (2)$$

k indicates a parameter corresponding to a2/a1.

For example, the calculation unit 903 substitutes the dimensions a1 and a2 included in the shape parameters sp1 and sp2 into k in the above Equation (2). The calculation unit 903 calculates the magnetization $J_{bulk}$ by substituting (H, J1) and (H, J2) into J1(H) and J2(H) in the above Equation (2) for each value of the magnetic field H while referring to the pieces of magnetization curve data md1 and md2. Accordingly, the magnetization curve data (H, $J_{bulk}$) indicating the magnetization J for each value of the magnetic field H may be obtained.

It is assumed that "perfect circular sphere" is specified as the shapes of the samples (samples S1 and S2). In this case, the calculation unit 903 specifies the following Equation (3) corresponding to the shape "elliptical sphere (perfect circular sphere)" as the function f while referring to the shape-specific function table 230. The calculation unit 903 calculates the magnetization $J_{bulk}(H)$ of the inner part of each of the sample based on the magnetization curve data md1 or md2 and the shape parameter sp1 or sp2 by using the following Equation (3).

$$J_{bulk}(H) = \frac{r1J1(H) - r2J1(H)}{r1 - r2} \quad (3)$$

r1 indicates a parameter corresponding to a1/2. r2 indicates a parameter corresponding to a2/2.

For example, the calculation unit 903 substitutes the dimensions a1 and a2 included in the shape parameters sp1 and sp2 into r1 and r2 of the above Equation (3). The calculation unit 903 calculates the magnetization $J_{bulk}$ by substituting (H, J1) and (H, J2) into J1(H) and J2 (H) in the above Equation (3) for each value of the magnetic field H while referring to the pieces of magnetization curve data md1 and md2. Accordingly, the magnetization curve data (H, $J_{bulk}$) indicating the magnetization $J_{bulk}$ for each value of the magnetic field H may be obtained.

It is assumed that "elliptical sphere other than perfect circular sphere" is specified as the shapes of the samples (samples S1 and S2). In this case, the calculation unit 903 specifies the following Equation (4) corresponding to the shape "elliptical sphere (other than perfect circular sphere)" as the function f while referring to the shape-specific function table 230. The calculation unit 903 calculates the magnetization $J_{bulk}(H)$ of the inner part of each of the samples based on the magnetization curve data md1 or md2 and the shape parameter sp1 or sp2" by using the following Equation (4).

$$J_{bulk}(H) = \frac{J1(H) - lJ2(H)}{1 - l} \quad (4)$$

I indicates a parameter corresponding to a2/a1.

For example, the calculation unit 903 substitutes the dimensions a1 and a2 included in the shape parameters sp1 and sp2 into I in the above Equation (4). The calculation unit 903 calculates the magnetization $J_{bulk}$ by substituting (H, J1) and (H, J2) into J1(H) and J2 (H) in the above Equation (4) for each value of the magnetic field H while referring to the pieces of magnetization curve data md1 and md2. Accordingly, the magnetization curve data (H, $J_{bulk}$) indicating the magnetization $J_{bulk}$ for each value of the magnetic field H may be obtained.

It is assumed that "elliptical cylinder" is specified as the shapes of the samples (samples S1 and S2). In this case, the calculation unit 903 specifies the following Equation (5) corresponding to the shape "elliptical cylinder" as the function f while referring to the shape-specific function table 230. The calculation unit 903 calculates the magnetization $J_{bulk}(H)$ of the inner part of each of the samples based on the magnetization curve data md1 or md2 and the shape parameter sp1 or sp2 by using the following Equation (5).

$$J_{bulk}(H) = \frac{h1J1(H) - h2J2(H)}{h1 - h2} \quad (5)$$

h1 represents a parameter corresponding to the dimension c1 of the sample S1. h2 indicates a parameter corresponding to the dimension c2 of the sample S2.

For example, the calculation unit 903 substitutes the dimensions c1 and c2 included in the shape parameters sp1 and sp2 into h1 and h2 of the above Equation (5). The calculation unit 903 calculates the magnetization $J_{bulk}$ by substituting (H, J1) and (H, J2) into J1(H) and J2 (H) in the above Equation (5) for each value of the magnetic field H while referring to the pieces of magnetization curve data md1 and md2. Accordingly, the magnetization curve data (H, $J_{bulk}$) indicating the magnetization $J_{bulk}$ for each value of the magnetic field H may be obtained.

A derivation example of the function f output from the model M will be described later with reference to FIGS. 10 to 13.

The output unit 904 outputs the calculation result. An output form of the output unit 904 may be implemented in a form including, for example, storing into the storage device such as the memory 302 or the disk 304, transmitting from the communication I/F 305 to other computers, displaying on a display (not illustrated), and outputting to a printer (not illustrated) for printing.

For example, the output unit 904 outputs the magnetization curve data indicating the calculated magnetization $J_{bulk}$ (H) of the inner part of each of the samples as the corrected magnetization curve data in which the measurement error due to the influence of the surface deterioration is removed from the magnetization curve data md1 or md2. A specific example of the corrected magnetization curve data will be described later with reference to FIG. 14.

The above-described functional units of the information processing apparatus 201 may be realized by a plurality of computers (for example, the information processing apparatus 201 and the client apparatus 202) in the information processing system 200.

(Derivation Example of Function f)

Next, the derivation example of the function f output from the model M will be described with reference to FIGS. 10 to 13. The cuboid (cube), the elliptical sphere (perfect circular sphere), and then elliptical cylinder will be described as examples of the shapes of the objects (samples S1 and S2).

Figure 10:
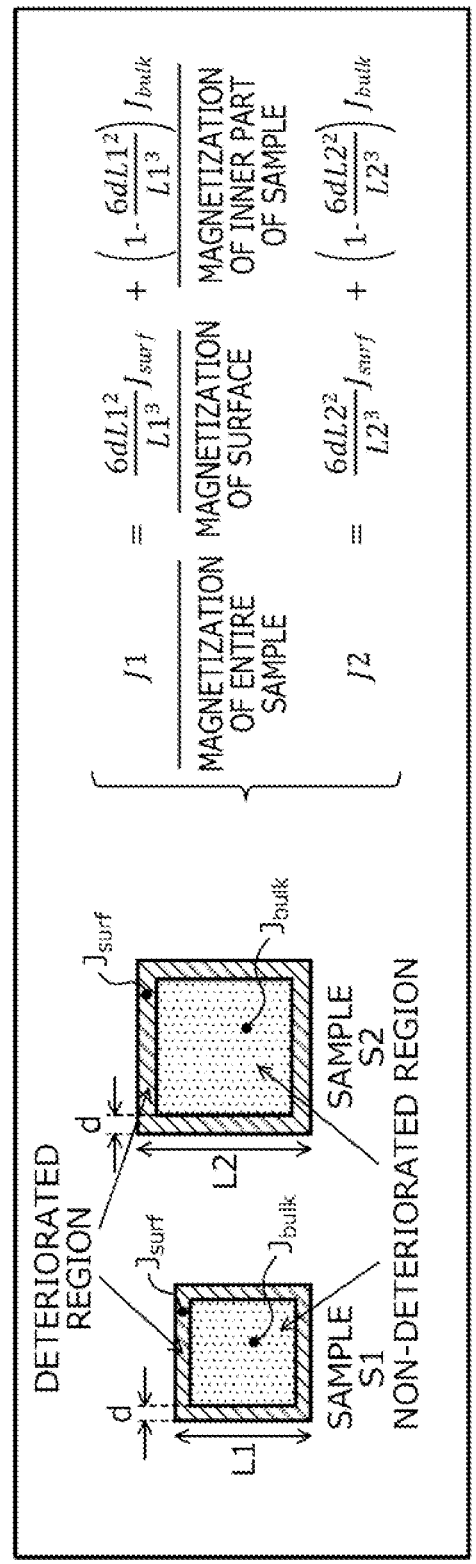
FIG. 10 is an explanatory diagram illustrating a first derivation example of a function.

FIG. 10 is an explanatory diagram illustrating a first derivation example of the function f. In FIG. 10, the samples S1 and S2 indicate two samples having the shape of "cuboid (cube)". It is assumed that a length of one side (depth, width, or height) of the sample S1 is "L1", and a length of one side (depth, width, or height) of the sample S2 is "L2".

It is assumed that a thickness of the surface part (deteriorated region) of the sample S1 or S2 is "d". Since the samples S1 and S2 are machined by the same method, it may be assumed that the thicknesses of the deteriorated regions are the same. In a case where the shape is "cuboid (cube)", when the entire magnetization of each of the samples S1 and S2 is represented by separating the magnetization into the magnetization component of the surface part and the magnetization component of the inner part by using the model M, the following Equations (6) and (7) are obtained.

$$J1 = \frac{6dL1^2}{L1^3} J_{surf} + \left(1 - \frac{6dL1^2}{L1^3}\right) J_{bulk} \quad (6)$$

$$J2 = \frac{6dL2^2}{L2^3} J_{surf} + \left(1 - \frac{6dL2^2}{L2^3}\right) J_{bulk} \quad (7)$$

In the above Equations (6) and (7), a left side represents the magnetization of the entire sample. In the above Equations (6) and (7), a first term on a right side represents the magnetization component of the sample surface, and a second term on the right side represents the magnetization component of the inner part of the sample. The coefficient part of $J_{surf}$ of the first term on the right side corresponds to the ratio of the volume of the surface part to the volume of the entire sample S1. The coefficient part of $J_{bulk}$ of the second term on the right side corresponds to the ratio of the volume of the inner part to the volume of the entire sample S1. For example, the coefficient part of $J_{surf}$ and the coefficient part of $J_{bulk}$ correspond to the volume ratio between the surface part and the inner part of the sample S1.

In the above Equations (6) and (7), the notation of H is omitted (for example, "$J_{bulk}(H)$" is denoted as "$J_{bulk}$").

The calculation unit 903 may derive the above Equation (1) by solving simultaneous equations including the above Equations (6) and (7) for $J_{bulk}$. "d" representing the thickness of the surface part (deteriorated region) of the sample S1 or S2 is not included in the above Equation (1). Thus, the corrected magnetization curve data in which the measurement error due to the surface deterioration is removed may be obtained without giving the thickness of the deteriorated region as a parameter, for example, without measuring "d".

The above Equation (2) in a case where the shape is "cuboid (other than cube)" may be derived by the same method as the above Equation (1).

Figure 11:
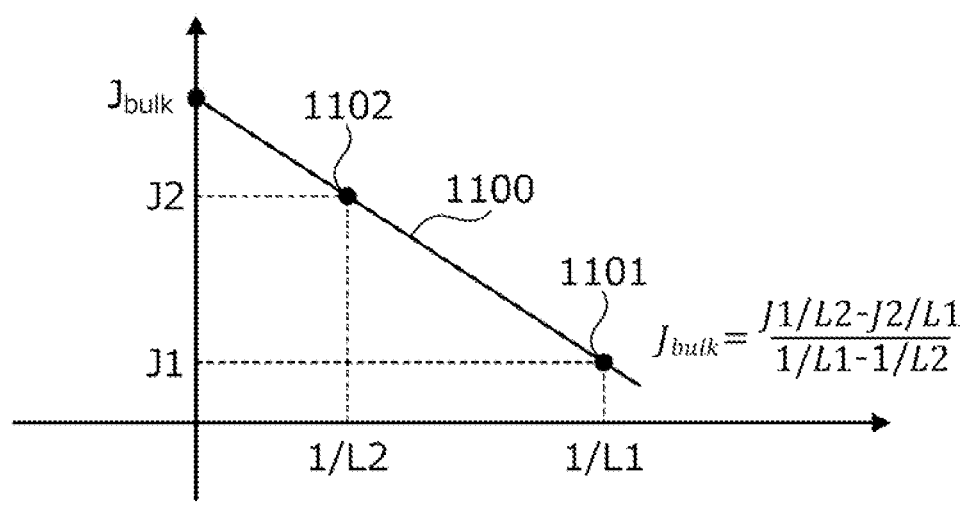
FIG. 11 is an explanatory diagram illustrating a correspondence between a size and magnetization of a sample.

FIG. 11 is an explanatory diagram illustrating a correspondence between the size and the magnetization of the sample. In FIG. 11, a graph 1100 represents the magnetization that changes in accordance with the size of the sample. A horizontal axis indicates a reciprocal (inverse) of the size. A vertical axis indicates the magnetization. It is assumed that the shape of the sample is "cube" and the size of the sample is "length of one side of cube".

A graph 1100 is a straight line that couples a point 1101 at which the magnetization J1 in the case of the size L1 is plotted and a point 1102 at which the magnetization J2 in the case of the size L2 is plotted at a certain value of the magnetic field H. The magnetization $J_{bulk}$ is an intercept of the graph 1100, and represents the magnetization when the size L is infinite.

When the size of the sample is changed, since a ratio between the deteriorated region (surface part) and the non-deteriorated region (inner part) changes, the magnetization of the sample changes. The magnetization when the size L is infinite corresponds to the magnetization when the influence of the surface deterioration is close to 0 (infinitesimal). In the model M, the magnetization J when the size L (L1 or L2) is infinite is the magnetization $J_{bulk}$.

Accordingly, it may be said that the model M may appropriately perform modeling of the magnetization of the sample, and it may be said that the magnetization in which the measurement error due to the influence of the surface deterioration is removed may be obtained by obtaining the magnetization $J_{bulk}$ by using the function f derived from the model M.

Next, a case where the objects (samples S1 and S2) having the shape of "elliptical sphere (perfect circular sphere)" will be described.

Figure 12:
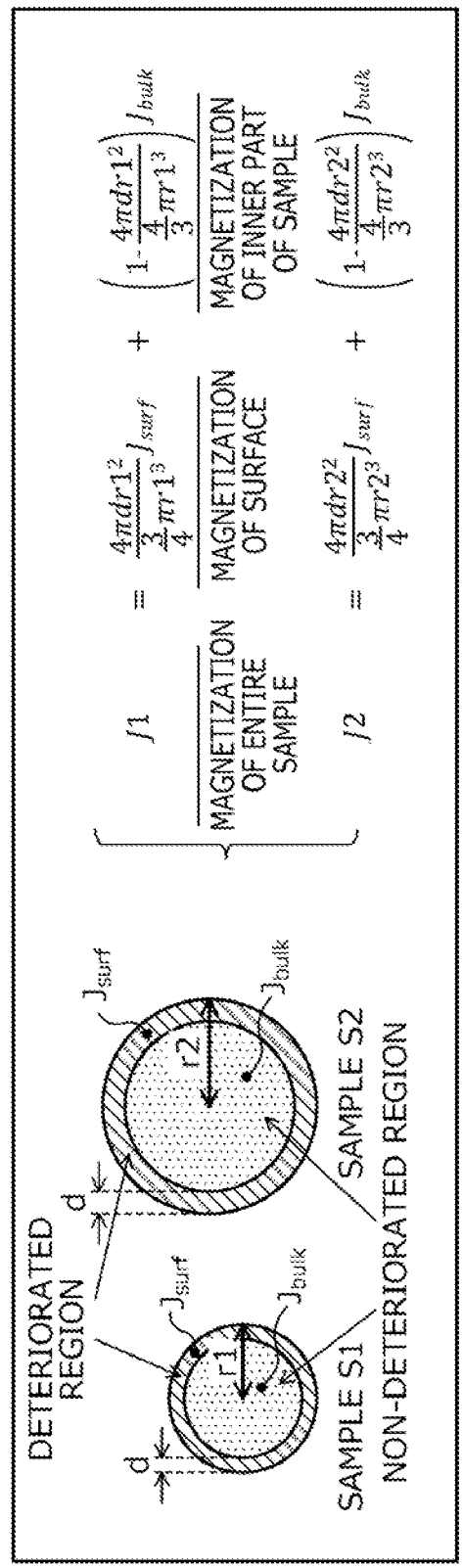
FIG. 12 is an explanatory diagram illustrating a second derivation example of the function.

FIG. 12 is an explanatory diagram illustrating a second derivation example of the function f. In FIG. 12, the samples S1 and S2 indicate two samples having the shape of "elliptical sphere (perfect circular sphere)". It is assumed that a radius of the sample S1 is "r1" and a radius of the sample S2 is "r2". It is assumed that a thickness of the surface part (deteriorated region) of the sample S1 or S2 is "d".

In a case where the shape is "elliptical sphere (perfect circular sphere)", when the entire magnetization of each of the samples S1 and S2 is represented by separating into the magnetization component of the surface part and the magnetization component of the inner part by using the model M, the following Equations (8) and (9) are obtained.

$$J1 = \frac{4\pi dr1^2}{\frac{4}{3}\pi r1^3} J_{surf} + \left(1 - \frac{4\pi dr1^2}{\frac{4}{3}\pi r1^3}\right) J_{bulk} \quad (8)$$

$$J2 = \frac{4\pi dr2^2}{\frac{4}{3}\pi r2^3} J_{surf} + \left(1 - \frac{4\pi dr2^2}{\frac{4}{3}\pi r2^3}\right) J_{bulk} \quad (9)$$

In the above Equations (8) and (9), a left side represents the magnetization of the entire sample. In the above Equations (8) and (9), a first term on a right side represents the magnetization component of the sample surface, and a second term on the right side represents the magnetization component of the inner part of the sample. The coefficient part of $J_{surf}$ of the first term on the right side corresponds to the ratio of the volume of the surface part to the volume of the entire sample S1. The coefficient part of $J_{bulk}$ of the second term on the right side corresponds to the ratio of the volume of the inner part to the volume of the entire sample S1. For example, the coefficient part of $J_{surf}$ and the coefficient part of $J_{bulk}$ correspond to the volume ratio between the surface part and the inner part of the sample S1.

In the above Equations (8) and (9), the notation of H is omitted.

The calculation unit 903 may derive the above Equation (3) by solving simultaneous equations including the above Equations (8) and (9) for $J_{bulk}$. "d" representing the thickness of the surface part (deteriorated region) of the sample S1 or S2 is not included in the above Equation (3). Thus, the corrected magnetization curve data in which the measurement error due to the surface deterioration is removed may be obtained without giving the dimension of the deteriorated region as the shape parameter, for example, without measuring "d". The above Equation (4) in the case where the shape is "elliptical sphere (other than perfect circular sphere)" may also be derived by the same method as the above Equation (3).

Next, a case where the shapes of the objects (samples S1 and S2) are "elliptical cylinder" will be described. However, it is assumed that a shape of a circle of the elliptical cylinder is "perfect circle".

Figure 13:
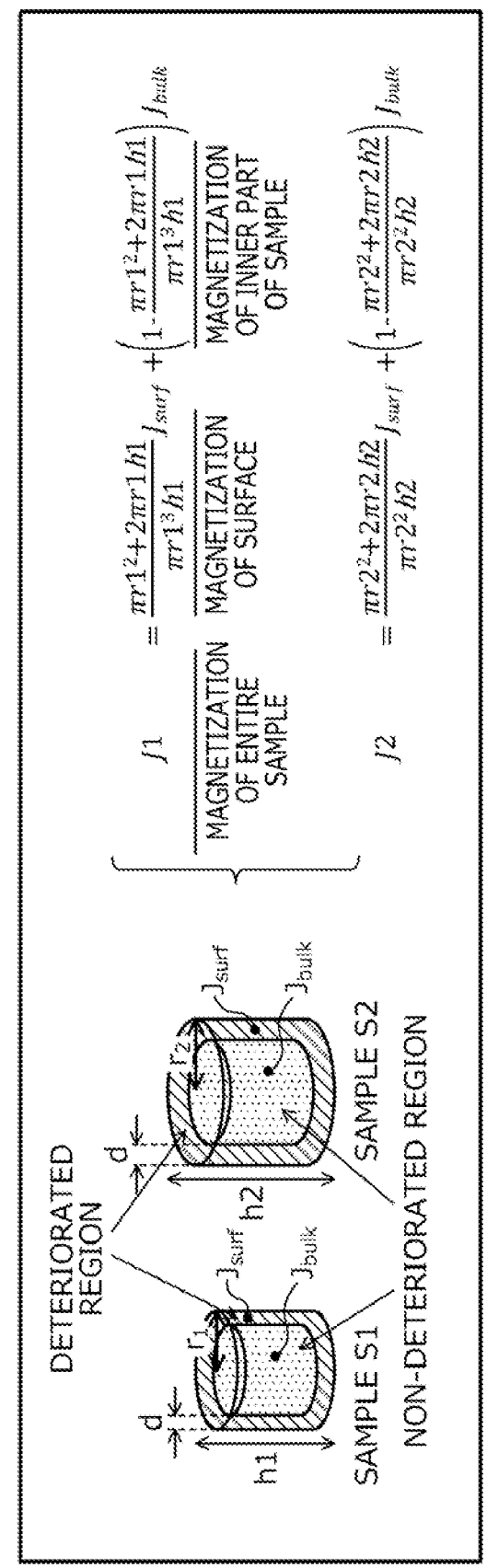
FIG. 13 is an explanatory diagram illustrating a third derivation example of the function.

FIG. 13 is an explanatory diagram illustrating a third derivation example of the function f. In FIG. 13, the samples S1 and S2 indicate two samples having the shape of "elliptical cylinder". It is assumed that a radius of the sample S1 is "r1" and a radius of the sample S2 is "r2". It is assumed that a thickness of the surface part (deteriorated region) of the sample S1 or S2 is "d".

In the case where the shape is "elliptical cylinder", when the entire magnetization of each of the samples S1 and S2 is represented by separating the magnetization into the magnetization component of the surface part and the magnetization component of the inner part by using the model M, the following Equations (10) and (11) are obtained.

$$J1 = \frac{\pi r1^2 + 2\pi r1 h1}{\pi r1^2 h1} J_{surf} + \left(1 - \frac{\pi r1^2 + 2\pi r1 h1}{\pi r1^2 h1}\right) J_{bulk} \quad (10)$$

$$J2 = \frac{\pi r2^2 + 2\pi r2 h2}{\pi r2^2 h2} J_{surf} + \left(1 - \frac{\pi r2^2 + 2\pi r2 h2}{\pi r2^2 h2}\right) J_{bulk} \quad (11)$$

In the above Equations (10) and (11), a left side represents the magnetization of the entire sample. In the above Equations (10) and (11), a first term on a right side represents the magnetization component of the sample surface, and a second term on the right side represents the magnetization component of the inner part of the sample. The coefficient part of $J_{surf}$ of the first term on the right side corresponds to the ratio of the volume of the surface part to the volume of the entire sample S1. The coefficient part of $J_{bulk}$ of the second term on the right side corresponds to the ratio of the volume of the inner part to the volume of the entire sample S1. For example, the coefficient part of $J_{surf}$ and the coefficient part of $J_{bulk}$ correspond to the volume ratio between the surface part and the inner part of the sample S1.

In the above Equations (10) and (11), the notation of H is omitted.

The calculation unit 903 may derive the above Equation (5) by solving simultaneous equations including the above Equations (10) and (11) for $J_{bulk}$. "d" representing the thickness of the surface part (deteriorated region) of the sample S1 or S2 is not included in the above Equation (5).

Thus, the corrected magnetization curve data in which the measurement error due to the surface deterioration is removed may be obtained without giving the thickness of the deteriorated region as a parameter, for example, without measuring "d". Although the case where the shape of the circle of the elliptical cylinder is "perfect circle" has been described as an example, the same applies to the case where the shape of the circle of the elliptical cylinder is other than the perfect circle.

(Specific Examples of Corrected Magnetization Curve Data)

Next, specific examples of the corrected magnetization curve data will be described with reference to FIG. 14.

Figure 14:
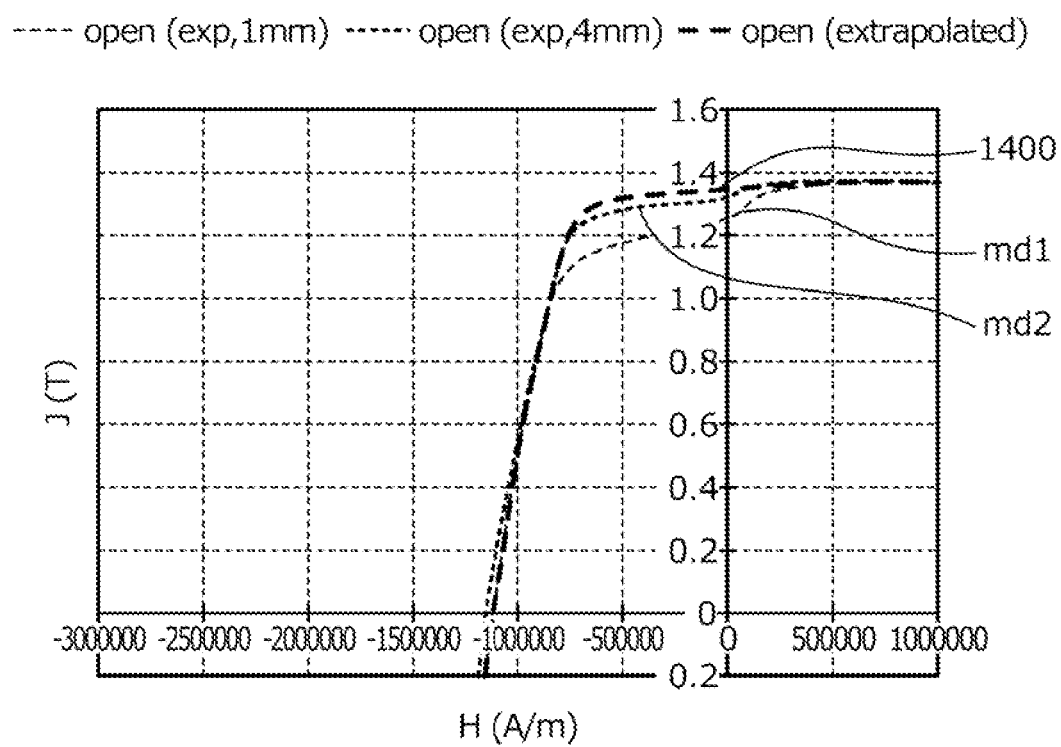
FIG. 14 is an explanatory diagram illustrating a specific example of corrected magnetization curve data.

FIG. 14 is an explanatory diagram illustrating the specific examples of the corrected magnetization curve data. In FIG. 14, the magnetization curve data md1 indicates the magnetization curve of the sample S1 measured by the open magnetic circuit type. The sample S1 is a cube having a length of one side of "1 mm". The magnetization curve data md2 indicates the magnetization curve of the sample S2 measured by the open magnetic circuit type. The sample S2 is a cube having a length of one side of "4 mm".

Magnetization curve data 1400 is the corrected magnetization curve data that is calculated based on the pieces of magnetization curve data md1 and md2 and the shape parameters sp1 and sp2 by using the above Equation (1) and indicates the magnetization (magnetization $J_{bulk}$) of the permanent magnet (object). In the magnetization curve data 1400, it is seen that the measurement error such as the level difference caused by the influence of the surface deterioration is removed.

Accordingly, when the characteristics of the permanent magnet are measured, even in a case where the sample having the small size of 4 mm or less is used, the magnetization curve data with no measurement error may be obtained.

(Correction Processing Procedure of Information Processing Apparatus 201)

Next, a correction processing procedure of the information processing apparatus 201 will be described with reference to FIGS. 15 and 16.

Figure 15:
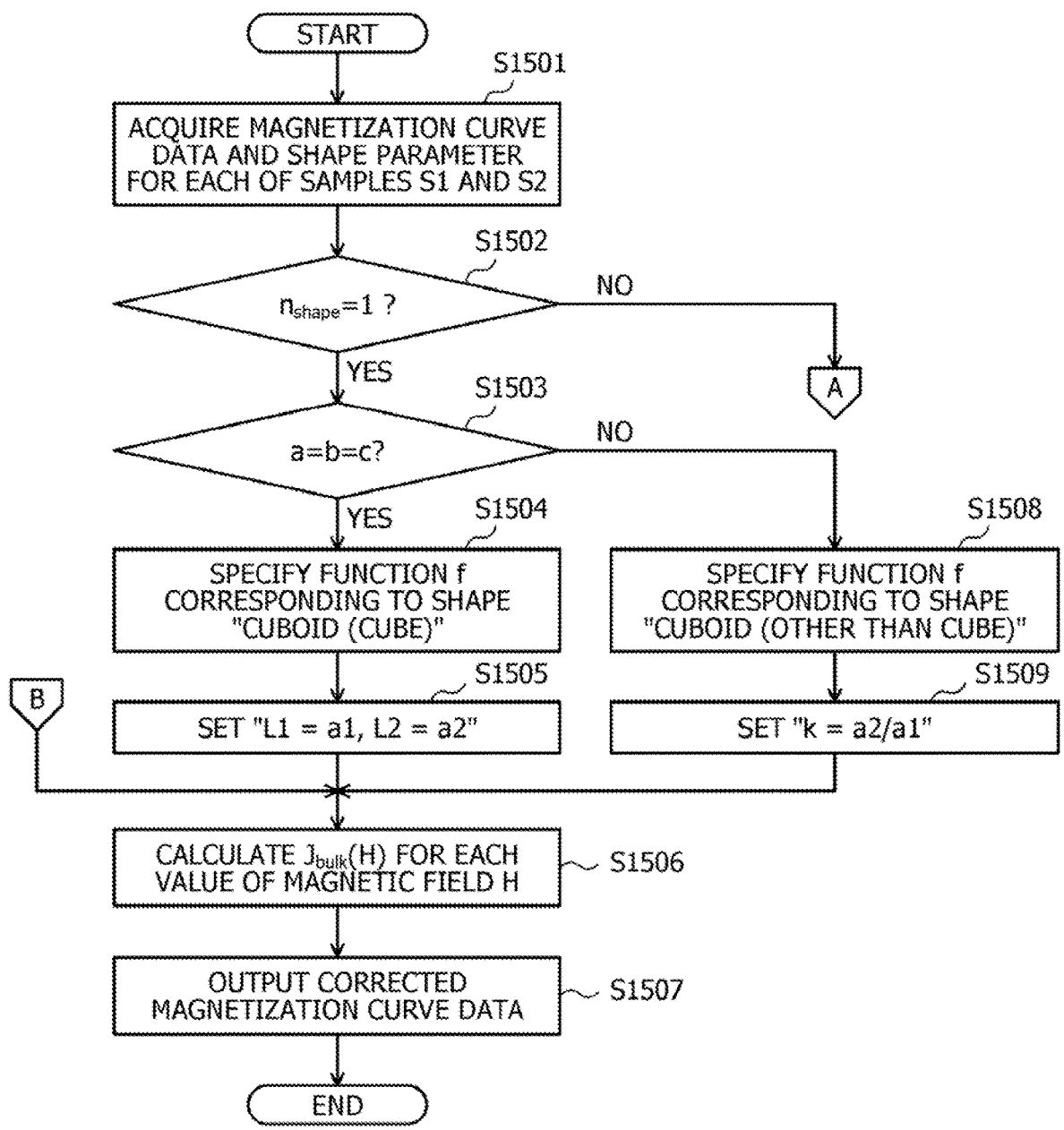
FIG. 15 is a flowchart (part 1) illustrating an example of a correction processing procedure of the information processing apparatus.

FIGS. 15 and 16 are flowcharts illustrating an example of the correction processing procedure of the information processing apparatus 201. In the flowchart of FIG. 15, the information processing apparatus 201 acquires the measured magnetization curve data and shape parameter for each of the samples S1 and S2 (step S1501).

Subsequently, the information processing apparatus 201 determines whether or not "$n_{shape}=1$" based on the shape parameter of each of the samples S1 and S2 while referring to the shape determination table 220 (step S1502). In the case of "$n_{shape}=1$" (step S1502: Yes), the information processing apparatus 201 determines whether or not "a=b=c" based on the shape parameter of each of the samples S1 and S2 (step S1503).

In the case of "a=b=c" (step S1503: Yes), the information processing apparatus 201 specifies the function f corresponding to the shape "cuboid (cube)" while referring to the shape-specific function table 230 (step S1504). The specified function f is the above Equation (1).

The information processing apparatus 201 sets "L1=a1, L2=a2" while referring to the shape parameter of each of the samples S1 and S2 (step S1505). Subsequently, the information processing apparatus 201 calculates the magnetization $J_{bulk}(H)$ for each value of the magnetic field H by using the function f based on the magnetization curve data of each of the samples S1 and S2 (step S1506).

The information processing apparatus 201 outputs, as the corrected magnetization curve data, the magnetization curve data (H, $J_{bulk}$) indicating the magnetization $J_{bulk}$ for each of the calculated values of the magnetic field H (step S1507), and terminates the series of processing according to the flowchart.

In a case where "a=b=c" is not established in step S1503 (step S1503: No), the information processing apparatus 201 specifies the function f corresponding to the shape "cuboid (other than cube)" while referring to the shape-specific function table 230 (step S1508). The specified function f is the above Equation (2).

The information processing apparatus 201 sets "k=a2/a1" (step S1509) while referring to the shape parameter of each of the samples S1 and S2, and proceeds to step S1506. In a case where "$n_{shape} \neq 1$" in step S1502 (step S1502: No), the information processing apparatus 201 proceeds to step S1601 illustrated in FIG. 16.

In the flowchart of FIG. 16, first, the information processing apparatus 201 determines whether or not "$n_{shape}=2$" based on the shape parameter of each of the samples S1 and S2 while referring to the shape determination table 220 (step S1601). In the case of "$n_{shape}=2$" (step S1601: Yes), the information processing apparatus 201 determines whether or not "a=b=c" based on the shape parameter of each of the samples S1 and S2 (step S1602).

In the case of "a=b=c" (step S1602: Yes), the information processing apparatus 201 refers to the shape-specific function table 230 to specify the function f corresponding to the shape "elliptical sphere (perfect circular sphere)" (step S1603). The specified function f is the above Equation (3). The information processing apparatus 201 sets "r1=a1/2, r2=a2/2" while referring to the shape parameter of each of the samples S1 and S2 (step S1604), and proceeds to step S1506 illustrated in FIG. 15.

In a case where "a=b=c" is not established in step S1602 (step S1602: No), the information processing apparatus 201 specifies the function f corresponding to the shape "elliptical sphere (other than perfect circular sphere)" while referring to the shape-specific function table 230 (step S1605). The specified function f is the above Equation (4). The information processing apparatus 201 sets "l=a2/a1" while referring to the shape parameter of each of the samples S1 and S2 (step S1606), and proceeds to step S1506 illustrated in FIG. 15.

In the case of "$n_{shape}=3$" in step S1601 (step S1601: No), the information processing apparatus 201 specifies the function f corresponding to the shape "elliptical cylinder" while referring to the shape-specific function table 230 (step S1607). The specified function f is the above Equation (5). The information processing apparatus 201 sets "h1=c1, h2=c2" while referring to the shape parameter of each of the samples S1 and S2 (step S1608), and proceeds to step S1506 illustrated in FIG. 15.

Accordingly, the corrected magnetization curve data in which the measurement error due to the influence of the surface deterioration is removed may be obtained.

As described above, the information processing apparatus 201 according to the embodiment may acquire the measured magnetization curve data and shape parameter for each of the two samples (samples S1 and S2) that are the objects made of the same material, have different sizes, and have similar shapes, may calculate the magnetization of the inner parts of the samples (samples S1 and S2) based on the acquired magnetization curve data and shape parameter of each of the samples by using the model M, and may output the calculated result. The model M is information representing the magnetization of the object by separating the magnetization of the object into the magnetization component of the surface part and the magnetization component of the inner part of the object in accordance with the volume ratio between the surface part and the inner part of the object. The measured magnetization curve data is, for example, the magnetization curve data measured by the open magnetic circuit type.

Accordingly, the magnetization curve data of the two samples S1 and S2 that are made of the same material, have different sizes, and have similar shapes is used, and thus, the measurement error due to the influence of the surface deterioration which appears markedly by using the sample having the smaller size may be removed.

According to the information processing apparatus 201, the magnetization of the inner part of each of the samples may be calculated based on the magnetization curve data and the shape parameter of the sample by using the function f which is derived from the model M and represents the magnetization of the inner part of the sample from the magnetization and the dimension of each of the two samples (samples S1 and S2).

Accordingly, the corrected magnetization curve data in which the measurement error due to the surface deterioration is removed may be obtained from the dimension such as the length of the side of the sample S1 or S2, the size of the diameter, or the like without giving the thickness of the deteriorated region of the sample S1 or S2 (for example, "d" illustrated in FIG. 10) as the parameter.

The information processing apparatus 201 may specify the shapes of the samples (samples S1 and S2) based on the acquired shape parameters, may specify the function f corresponding to the specified shapes while referring to the storage unit 910 (for example, the shape-specific function table 230), and may calculate the magnetization of the inner part of each of the samples based on the magnetization curve data and the shape parameter of the sample by using the specified function f. The storage unit 910 stores, in association with each of a plurality of types of shapes, the function f derived from the model M representing the magnetization of the object by separating the magnetization of the object into the magnetization component of the surface part and the magnetization component of the inner part of the object in accordance with the volume ratio between the surface part and the inner part of the object having the shape. The shape is, for example, any of the cuboid, the elliptical sphere, and the elliptical cylinder. The cuboid, the elliptical sphere, and the elliptical cylinder are general shapes employed for stably vibrating the sample by the open magnetic circuit type.

Accordingly, an appropriate function f corresponding to the shapes of the samples S1 and S2 is selected, and thus, the measurement error due to the influence of the surface deterioration may be removed from the magnetization curve data.

The information processing apparatus 201 may acquire the magnetization curve data and the shape parameter of each of the two samples (samples S1 and S2) machined by the same method.

Accordingly, this may ensure that the degrees of surface deterioration are the same between the samples.

Consequently, according to the information processing apparatus 201 (measurement apparatus 101) according to the embodiment, the accurate magnetization curve may be measured regardless of the size of the permanent magnet, and the characteristics of the permanent magnet may be accurately measured.

The measurement method described in the embodiment may be realized by causing a computer, such as a personal computer or a workstation, to execute a program prepared in advance. The measurement program is recorded on a computer-readable recording medium such as a hard disk, a flexible disk, the CD-ROM, the DVD, or the USB memory and is executed by being read by the computer from the recording medium. The measurement program may also be distributed via a network such as the Internet.

The information processing apparatus 201 (measurement apparatus 101) described in the embodiment may also be achieved with an IC for a specific application, such as a standard cell or a structured application-specific integrated circuit (ASIC), or with a programmable logic device (PLD), such as a field-programmable gate array (FPGA).

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A measurement apparatus for measuring magnetization of an object for an industrial product including a motor comprising:
   a memory; and
   a processor coupled to the memory and configured to:
   acquire, for each of two samples which are objects made of a same material, have different sizes, and have similar shapes, magnetization curve data measured for each of the two samples and a shape parameter including a dimension of each of the two samples;
   determine whether each of the two samples is a first shape based on the shape parameter of each of the two samples;
   determine, when determining that each of the two samples is the first shape, whether three sizes of the shape parameter of each of the two samples are the same based on the shape parameter of each of the two samples;
   specify, when determining that the three sizes of the shape parameter of each of the two samples are the same, a first function corresponding to a second shape;
   set one size of the three sizes of the shape parameter of each of the two samples to a first parameter and a second parameter of the first function;
   specify, when determining that the three sizes of the shape parameter of each of the two samples are not the same, a second function corresponding to a third shape;
   set a result obtained by dividing two sizes of the three sizes of the shape parameter of each of the two samples with each other to a third parameter of the second function;
   calculate magnetization of an inner part of each of the samples based on one of the first function and the second function and the acquired magnetization curve data of each of the two samples;
   output the calculated result; and
   use the calculated result to determine a permanent magnet which is used in the industrial product.

2. The measurement apparatus according to claim 1, wherein the first shape is a cuboid, the second shape is a cube and the third shape is a cuboid other than the cube.

3. The measurement apparatus according to claim 1, wherein the processor is configured to: store, in the memory, in association with each of a plurality of types of shapes, a function which includes the first function and the second function and is derived from the model that represents the magnetization of the object by separating the magnetization of the object into the magnetization component of the surface part and the magnetization component of the Inner part of the object in accordance with the volume ratio between the surface part and the inner part of the object that has the shape and which represents the magnetization of the inner part of each of the two samples from the magnetization and the dimension of each of the two samples.

4. The measurement apparatus according to claim 1, wherein the first shape is a cuboid, the second shape is an elliptical sphere, and the third shape is an elliptical cylinder.

5. The measurement apparatus according to claim 1, wherein the two samples are samples machined by a same method.

6. The measurement apparatus according to claim 1, wherein the magnetization curve data is magnetization curve data measured by an open magnetic circuit type.

7. A measurement method for measuring magnetization of an object for an industrial product including a motor comprising:
  acquiring, by a computer, for each of two samples which are objects made of a same material, have different sizes, and have similar shapes, magnetization curve data measured for each of the two samples and a shape parameter including a dimension of each of the two samples;
  determining whether each of the two samples is a first shape based on the shape parameter of each of the two samples;
  determining, when determining that each of the two samples is the first shape, whether three sizes of the shape parameter of each of the two samples are the same based on the shape parameter of each of the two samples;
  specifying, when determining that the three sizes of the shape parameter of each of the two samples are the same, a first function corresponding to a second shape;
  setting one size of the three sizes of the shape parameter of each of the two samples to a first parameter and a second parameter of the first function;
  specifying, when determining that the three sizes of the shape parameter of each of the two samples are not the same, a second function corresponding to a third shape;
  setting a result obtained by dividing two sizes of the three sizes of the shape parameter of each of the two samples with each other to a third parameter of the second function;
  calculating magnetization of an inner part of each of the samples based on one of the first function and the second function and the acquired magnetization curve data of each of the two samples;
  outputting the calculated result; and
  using the calculated result to determine a permanent magnet which is used in the industrial product.

8. A non-transitory computer-readable recording medium storing a measurement program causing a computer to execute a processing for measuring magnetization of an object for an industrial product including a motor, the processing comprising:
  acquiring, for each of two samples which are objects made of a same material, have different sizes, and have similar shapes, magnetization curve data measured for each of the two samples and a shape parameter including a dimension of each of the two samples;
  determining whether each of the two samples is a first shape based on the shape parameter of each of the two samples;
  determining, when determining that each of the two samples is the first shape, whether three sizes of the shape parameter of each of the two samples are the same based on the shape parameter of each of the two samples;
  specifying, when determining that the three sizes of the shape parameter of each of the two samples are the same, a first function corresponding to a second shape;
  setting one size of the three sizes of the shape parameter of each of the two samples to a first parameter and a second parameter of the first function;
  specifying, when determining that the three sizes of the shape parameter of each of the two samples are not the same, a second function corresponding to a third shape;
  setting a result obtained by dividing two sizes of the three sizes of the shape parameter of each of the two samples with each other to a third parameter of the second function;
  calculating magnetization of an inner part of each of the samples based on one of the first function and the second function and the acquired magnetization curve data of each of the two samples;
  outputting the calculated result; and
  using the calculated result to determine a permanent magnet which is used in the industrial product.

* * * * *